US012610565B2

(12) United States Patent
Frost et al.

(10) Patent No.: US 12,610,565 B2
(45) Date of Patent: Apr. 21, 2026

(54) THREE-DIMENSIONAL INTERLOCKED CORRUGATED CAPACITOR STRUCTURES

(71) Applicant: Intel Corporation, Santa Clara, CA (US)

(72) Inventors: Denzil Frost, Rio Rancho, NM, ID (US); Sudipto Naskar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 195 days.

(21) Appl. No.: 18/333,700

(22) Filed: Jun. 13, 2023

(65) Prior Publication Data

US 2024/0421181 A1 Dec. 19, 2024

(51) Int. Cl.
H10D 1/68 (2025.01)
H10D 1/00 (2025.01)

(52) U.S. Cl.
CPC ............. H10D 1/043 (2025.01); H10D 1/716 (2025.01)

(58) Field of Classification Search
None
See application file for complete search history.

(56) References Cited

U.S. PATENT DOCUMENTS

| | | | |
|---|---|---|---|
| 9,385,039 B2 | 7/2016 | Sakuma | |
| 9,536,784 B1 | 1/2017 | Farooq et al. | |
| 9,847,255 B2 | 12/2017 | Lin et al. | |
| 10,181,454 B2 | 1/2019 | Park | |

| | | | |
|---|---|---|---|
| 2010/0052099 A1 | 3/2010 | Chang et al. | |
| 2012/0012979 A1* | 1/2012 | Horak | H10D 1/043 |
| | | | 257/532 |
| 2012/0168902 A1 | 7/2012 | Zhu et al. | |
| 2017/0169958 A1* | 6/2017 | Zhou | H01G 11/26 |
| 2017/0194419 A1* | 7/2017 | Lee | H01G 4/232 |
| 2018/0158897 A1 | 6/2018 | Gong et al. | |
| 2018/0323200 A1* | 11/2018 | Tang | H10B 12/48 |
| 2021/0013143 A1* | 1/2021 | Lu | H01G 4/012 |
| 2021/0288047 A1 | 9/2021 | Lee et al. | |
| 2021/0375551 A1 | 12/2021 | Park | |
| 2021/0391335 A1* | 12/2021 | Xia | H10D 1/714 |
| 2025/0089280 A1* | 3/2025 | Baek | H10D 1/714 |

FOREIGN PATENT DOCUMENTS

JP 2010238826 A 10/2010

OTHER PUBLICATIONS

Lin, H et al "91.5%-Efficiency Fully Integrated Voltage Regulator with 86fF/μm/\2-High Density 2.5D MIM Capacitor", 2021 Symposium on VLSI Technology Digest of Technical Papers, 2021, 2 pages.

* cited by examiner

*Primary Examiner* — Benjamin P Sandvik
(74) *Attorney, Agent, or Firm* — Akona IP PC

(57) ABSTRACT

Disclosed herein are IC devices with 3D interlocked corrugated capacitor structures. An example IC device includes a support structure (e.g., a substrate, a die, a wafer, or a chip), an insulator material over the support structure, and a first and a second corrugated capacitor structures extending into the insulator material, where a projection of at least one of the protrusions of the first corrugated capacitor structure onto a plane parallel to the support structure overlaps with a projection of at least one of the protrusions of the second corrugated capacitor structure onto the plane.

22 Claims, 13 Drawing Sheets

THREE-DIMENSIONAL INTERLOCKED CORRUGATED CAPACITOR STRUCTURES

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize fabrication and performance of each component becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 2:
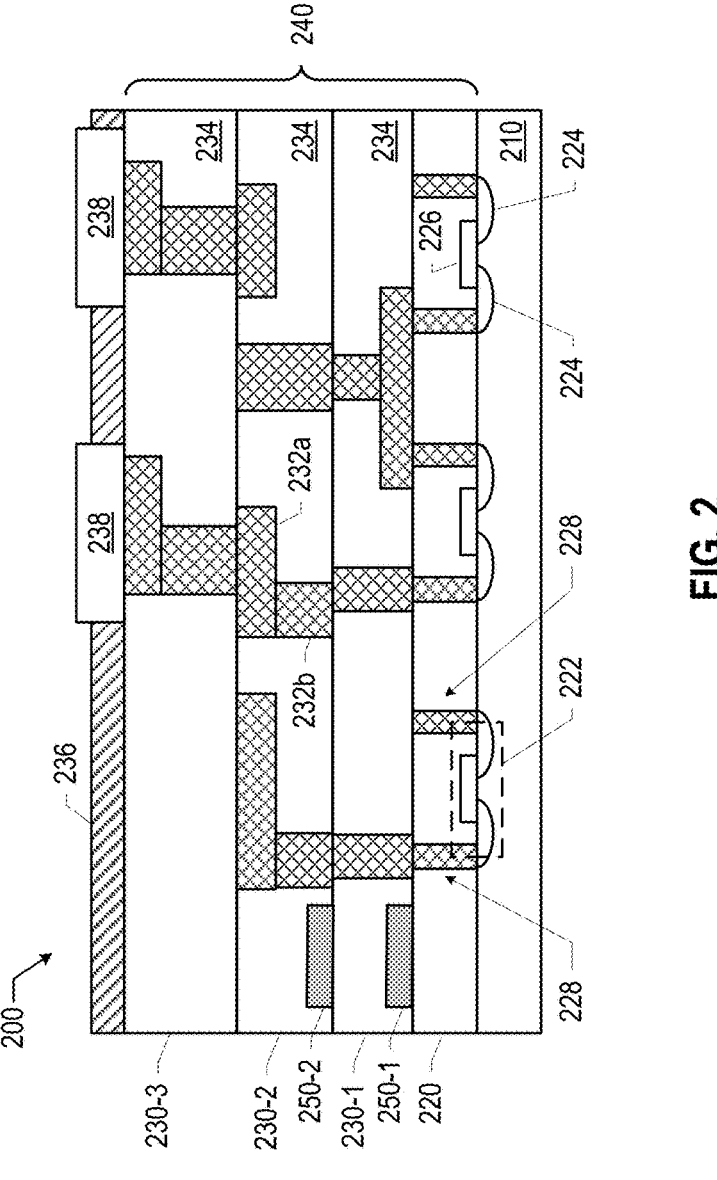
FIG. 2 illustrates a cross-sectional side view of an example IC device that may include one or more 3D interlocked corrugated capacitor structures in accordance with any of the embodiments disclosed herein.

Disclosed herein are IC devices with 3D interlocked corrugated capacitor structures. As used herein, a "corrugated capacitor structure" (or, simply, a "corrugated capacitor") refers to a structure that includes a via (or, more generally, an opening) extending substantially vertically into the insulator material by a length, and further includes protrusions from the via along the length of the via, the protrusions extending substantially horizontally into the insulator material away from the via, where a capacitor stack is provided (e.g., conformally deposited) on the inner walls of the structure. Such protrusions may also be referred to as "ledges." A capacitor stack includes a stack of a layer of a first electrically conductive material forming a first capacitor electrode, a layer of an insulator material forming a capacitor insulator, and a layer of a second electrically conductive material forming a second capacitor electrode. Because first and second electrically conductive material may be metals, such a capacitor structure is a metal-insulator-metal (MIM) capacitor structure. An example IC device includes a support structure (e.g., a substrate, a die, a wafer, or a chip), an insulator material over the support structure, and a first and a second corrugated capacitor structures extending into the insulator material, where a projection of at least one of the protrusions of the first corrugated capacitor structure onto a plane parallel to the support structure overlaps with a projection of at least one of the protrusions of the second corrugated capacitor structure onto the plane. Because the corrugated capacitor structures extend into the insulator material towards the support structure, these structures are 3D capacitor structures. Because projections of the protrusions of adjacent 3D corrugated capacitor structures onto a plane parallel to the support structure overlap, they may be described as being interlocked.

Fabrication of MIM capacitors currently used in the industry often requires multiple patterning steps and still often fails to provide enough capacitance per unit area. Each patterning step and each additional unit area occupied by a capacitor increases costs. 3D interlocked corrugated capacitor structures may allow providing MIM capacitors at a reduced cost due to simpler patterning, while maintaining the ability to provide independent connections between capacitor electrodes and the power delivery network. Because capacitor structures proposed herein are 3D and because individual corrugated capacitors are interlocked, they offer higher capacitance per unit area compared to conventional capacitor structures.

In some implementations, 3D interlocked corrugated capacitor structures described herein may be used as decoupling capacitors. A decoupling capacitor is a capacitor used to decouple one part of an electrical network from another. Noise caused by other circuit elements can be shunted through the decoupling capacitor, reducing the effect it has on the rest of the circuit. Decoupling capacitors are typically included in semiconductor packages in order to lower the inductance through the package by reducing the lead length. Decoupling capacitors placed close to power consuming circuits are able to smooth out voltage variation with charges stored on them. The stored charge either dissipates or is used as a local power supply to device inputs during signal switching stages, allowing the decoupling capacitors to negate the effects of voltage noise induced into the system by parasitic inductance.

In some embodiments, 3D interlocked corrugated capacitor structures described herein may be moved to the back end of line (BEOL) layers (also referred to as "backend") of an advanced complementary metal-oxide-semiconductor (CMOS) process. In particular, including 3D interlocked corrugated capacitor structures in a metal layer of a metallization stack above a support (e.g., a substrate, a die, a wafer, or a chip) having active circuitry in the front end of line (FEOL) layer and, possibly, in lower BEOL layers may allow realizing decoupling capacitors with sufficient capacitive decoupling close to the active circuitry of an IC device without occupying valuable die area where active circuitry can be built. As such, 3D interlocked corrugated capacitor structures described herein may be used to address the scaling challenges of conventional decoupling capacitors and be compatible with advanced CMOS processes. Other technical effects will be evident from various embodiments described here.

Various IC devices with 3D interlocked corrugated capacitor structures as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. Although certain elements may be referred to in the singular herein, such elements may include multiple sub-elements. For example, "an insulator material" may include one or more insulator materials. The term "insulating" and variations thereof (e.g., "insulative" or "insulator") means "electrically insulating," the term "conducting" and variations thereof (e.g., "conductive" or "conductor") means "electrically conducting," unless otherwise specified. For example, the term "insulating material" refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon and alumina or a combination thereof. They may include dielectric materials, high polarizability materials, and/or piezoelectric materials. They may be transparent or opaque without departing from the scope of the present disclosure. With reference to optical signals and/or devices, components and elements that operate on or using optical signals, the term "conducting" can also mean "optically conducting."

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Any of the features discussed with reference to any of accompanying drawings herein may be combined with any other features to form IC devices with 3D interlocked corrugated capacitor structures, as appropriate. A number of elements of the drawings are shared with others of the drawings; for ease of discussion, a description of these elements is not repeated, and these elements may take the form of any of the embodiments disclosed herein. If multiple instances of certain elements are illustrated, then, in some cases, to not clutter the drawings only some of these elements may be labeled with a reference sign and other ones of these elements are not labeled (e.g., although FIG. 2 illustrates three transistors 222, only one of them is labeled with a reference sign). However, in other cases, for ease of explanation, different instances of a given element in a single drawing may be referred to with numbers 1, 2, and so on, after a dash (e.g., FIG. 2 illustrates two 3D interlocked corrugated capacitor structures, labeled individually as a first 3D interlocked corrugated capacitor structure 250-1 and a second 3D interlocked corrugated capacitor structure 250-2).

The drawings are not necessarily to scale. Although many of the drawings illustrate rectilinear structures with flat walls and right-angle corners, this is simply for ease of illustration and may not reflect real-life process limitations which may cause various features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used to describe a range of dimensions, the phrase "between X and Y" represents a range that includes X and Y. When used to describe a location of an element, the phrase "between X and Y" represents a region that is spatially between element X and element Y. The description may use the phrases "in an embodiment" or "in embodiments," which may each refer to one or more of the same or different embodiments. The terms "substantially," "close," "approximately," "near," and "about," generally refer to being within +/−20%, e.g., within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−20%, e.g., within +/−5% or within +/−2%, of a target value based on the context of a particular value as described herein or as known in the art.

Figure 1:
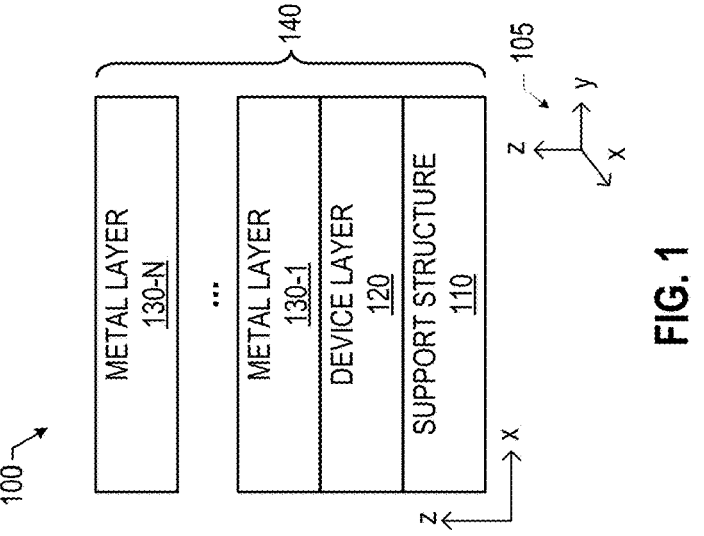
FIG. 1 illustrates a cross-sectional view of an example integrated circuit (IC) device in which one or more three-dimensional (3D) interlocked corrugated capacitor structures may be implemented, according to some embodiments of the present disclosure.

FIG. 1 illustrates a cross-sectional view of an example IC device 100 in which one or more 3D interlocked corrugated capacitor structures may be implemented, according to some embodiments of the present disclosure. FIG. 1 illustrates an example coordinate system 105 with axes x-y-z so that the various planes illustrated in FIG. 1 and in some subsequent drawings may be described with reference to this coordinate system.

As shown in FIG. 1, in general, the IC device 100 may include a support structure 110, a device layer 120, and a plurality of metal layers 130, labeled as a metal layer 130-1 through metal layer 130-N, where N is an integer greater than 1. Together, the metal layers 130 may be referred to as a metallization stack 140. The illustration of FIG. 1 is intended to provide a general orientation and arrangement of various layers with respect to one another, and, unless specified otherwise in the present disclosure, includes embodiments of the IC device 100 where portions of elements described with respect to one of the layers shown in FIG. 1 may extend into one or more, or be present in, other layers.

The support structure 110 may be any suitable support over which the device layer 120 and the metallization stack 140 may be provided. For example, the support structure 110 may be a substrate, a die, a wafer or a chip. The support structure 110 may, e.g., be the wafer 2000 of FIG. 13, discussed below, and may be, or be included in, a die, e.g., the singulated die 2002 of FIG. 13, discussed below. The support structure 110 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure 110 may be a printed circuit board (PCB) substrate. Although a few examples of materials from which the substrate may be formed are described here, any material that may serve as a foundation upon which a semiconductor device implementing any of the 3D interlocked corrugated capacitor structures as described herein may be built falls within the spirit and scope of the present disclosure.

The device layer 120 may include any combination of active ICs provided over the support structure 110. For example, in some embodiments, the device layer 120 may include various logic layers, circuits, and devices (e.g., logic transistors) to drive and control a logic IC. In some embodiments, the device layer 120 may include memory devices/circuits. In some embodiments, the device layer 120 may include one or more 3D interlocked corrugated capacitor structures as described herein.

Various layers of the metallization stack 140 may be, or include, metal layers of a BEOL. As used herein, the term "metal layer" may refer to a layer above a support structure 110 that includes electrically conductive interconnect structures (e.g., conductive lines and conductive vias) for providing electrical connectivity between different IC components. Metal layers described herein may also be referred to as "metal layers" to clearly indicate that these layers include electrically conductive interconnect structures which may, but does not have to, be metal. Various metal layers of the metallization stack 140 may be used to interconnect the various inputs and outputs of the active devices (e.g., transistors) in the device layer 120. Generally speaking, each of the metal layers of the metallization stack 140 may include a conductive line (also sometimes referred to as a "trench," a "trace," or a "metal line") and/or a conductive via. Conductive lines of a metal layer are configured for transferring signals and power along electrically conductive (e.g., metal) structures extending in the x-y plane (e.g., in the x or y directions), while the conductive vias of a metal layer are configured for transferring signals and power through electrically conductive structures extending in the z-direction, e.g., to any of the adjacent metal layers above or below. Accordingly, conductive vias connect interconnect structures (e.g., conductive lines and/or conductive vias) of one metal layer to interconnect structures of an adjacent metal layer. While referred to as "metal" layers, various layers of the metallization stack 140 may include only certain patterns of conductive metals, e.g., copper (Cu), aluminum (Al), tungsten (W), or cobalt (Co), or metal alloys, or more generally, patterns of an electrically conductive material, formed in an insulating medium such as an interlayer dielectric (ILD). The insulating medium may include any suitable ILD materials such as silicon oxide, carbon-doped silicon oxide, silicon carbide, silicon nitride, aluminum oxide, and/or silicon oxynitride.

One example implementation of the IC device 100 is shown in FIG. 2. FIG. 2 illustrates a cross-sectional side view of an example IC device 200 that may include one or more 3D interlocked corrugated capacitor structures in accordance with any of the embodiments disclosed herein. The IC device 200 is an example of the IC device 100, as explained below.

Figure 13:
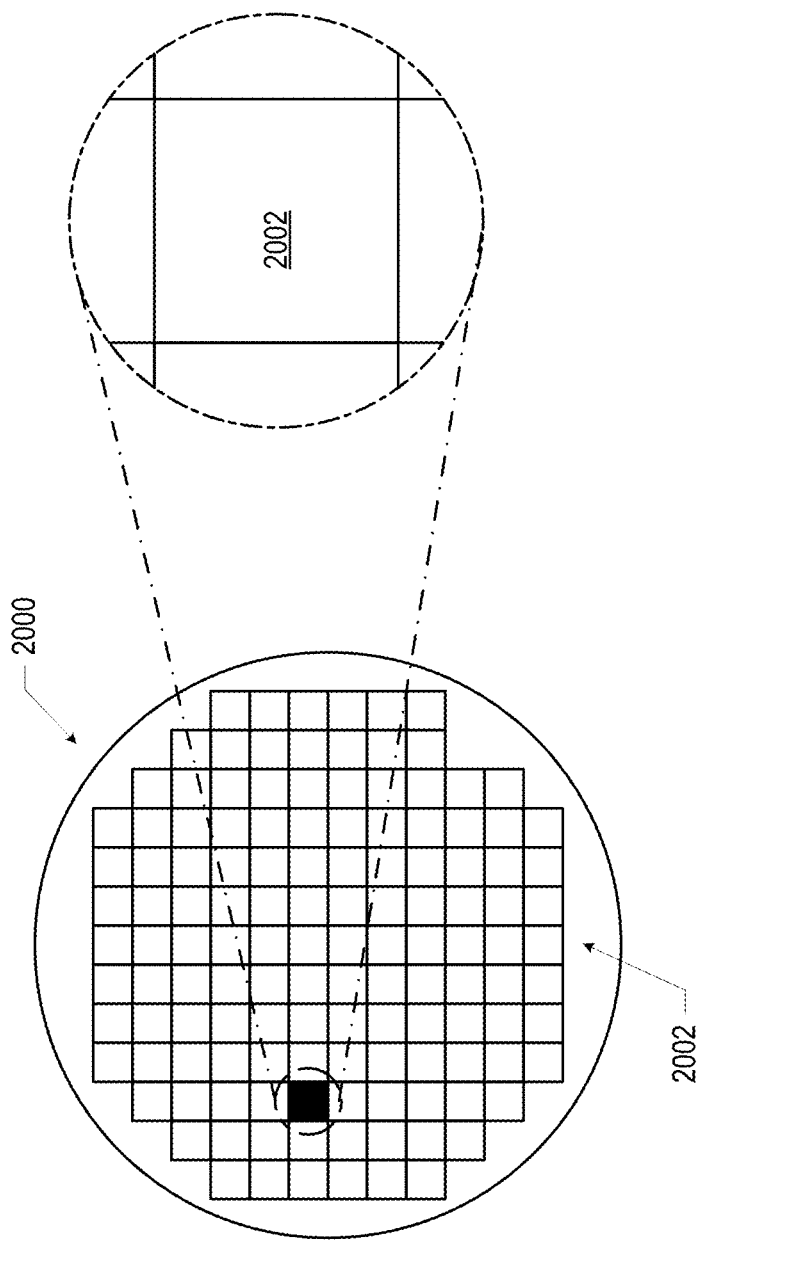
FIG. 13 illustrates top views of a wafer and dies that include one or more 3D interlocked corrugated capacitor structures in accordance with any of the embodiments disclosed herein.

The IC device 200 may be formed on a substrate 210, where the substrate 210 may be any suitable support structure as described herein, e.g., the support structure 110 of FIG. 1 and/or the wafer 2000 of FIG. 13. The substrate 210 may be part of a singulated die (e.g., the dies 2002 of FIG. 13) or a wafer (e.g., the wafer 2000 of FIG. 13).

The IC device 200 may include one or more device layers 220 disposed on the substrate 210, where, together, the one or more device layers 220 may be an example of the device layer 120 of the IC device 100. The device layer 220 may include features of one or more transistors 222 (e.g., metal-oxide-semiconductor field-effect transistors (MOSFETs)) formed on the substrate 210. The device layer 220 may include, for example, one or more source and/or drain (S/D) regions 224, a gate 226 to control current flow in the transistors 222 between the S/D regions 224, and one or more S/D contacts 228 to route electrical signals to/from the S/D regions 224. The transistors 222 may include additional features not depicted for the sake of clarity, such as device isolation regions, gate contacts, and the like. The transistors 222 are not limited to the type and configuration depicted in FIG. 2 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

The S/D regions 224 may be formed within the substrate 210 adjacent to the gate 226 of each transistor 222, using any suitable processes known in the art. For example, the S/D regions 224 may be formed using either an implantation/diffusion process or a deposition process. In the former process, dopants such as boron, aluminum, antimony, phosphorous, or arsenic may be ion-implanted into the substrate 210 to form the S/D regions 224. An annealing process that activates the dopants and causes them to diffuse farther into the substrate 210 may follow the ion implantation process. In the latter process, an epitaxial deposition process may provide material that is used to fabricate the S/D regions 224. In some implementations, the S/D regions 224 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 224 may be formed using one or more alternate semiconductor materials such as germanium or a group III-V material or alloy. In further embodiments, one or more layers of metal and/or metal alloys may be used to form the S/D regions 224. In some embodiments, an etch process may be performed before the epitaxial deposition to create recesses in the substrate 210 in which the material for the S/D regions 224 is deposited.

Each transistor 222 may include a gate 226 formed of at least two layers, a gate electrode layer and a gate dielectric layer.

The gate electrode layer may be formed on the gate interconnect support layer and may consist of at least one P-type workfunction metal or N-type workfunction metal, depending on whether the transistor is to be a P-type metal-oxide-semiconductor (PMOS) or an N-type metal-oxide-semiconductor (NMOS) transistor, respectively. In some implementations, the gate electrode layer may consist of a stack of two or more metal layers, where one or more metal layers are workfunction metal layers and at least one metal layer is a fill metal layer. Further metal layers may be included for other purposes, such as a barrier layer or/and an adhesion layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, aluminum carbide, tungsten, tungsten carbide. An N-type metal layer will enable the formation of an NMOS gate electrode with a workfunction that is between about 3.9 eV and about 4.2 eV.

In some embodiments, when viewed as a cross-section of the transistor 222 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a FinFET transistor does not have a "flat" upper surface, but instead has a rounded peak).

Generally, the gate dielectric layer of a transistor 222 may include one layer or a stack of layers, and the one or more layers may include silicon oxide, silicon dioxide, and/or a high-k dielectric material. The high-k dielectric material included in the gate dielectric layer of the transistor 222 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

Electrical signals, such as power and/or input/output (I/O) signals, may be routed to and/or from the transistors 222 of the device layer 220 through one or more metal layers 230 disposed on the device layer 220, illustrated in FIG. 2 as metal layers 230-1, 230-2, and 230-3. For example, electrically conductive features of the device layer 220 (e.g., the gate 226 and the S/D contacts 228) may be electrically coupled with the interconnect structures 232 of the metal layers 230. Although a particular number of metal layers 230 is depicted in FIG. 2, embodiments of the present disclosure include IC devices having more or fewer metal layers than depicted. The one or more metal layers 230 may form a metallization stack 240 of the IC device 200. The metal layers 230 are examples of the metal layers 130 of the IC device 100, and the metallization stack 240 is an example of the metallization stack 140 of the IC device 100.

The interconnect structures 232 may be arranged within the metal layers 230 to route electrical signals according to a wide variety of designs (in particular, the arrangement is not limited to the particular configuration of interconnect structures 232 depicted in FIG. 2). In some embodiments, the interconnect structures 232 may include conductive lines 232a and/or conductive vias 232b, formed of an electrically conductive material such as a metal. The conductive lines 232a may be arranged to route electrical signals in a direction of a plane that is substantially parallel with a surface of the substrate 210 upon which the device layer 220 is formed. For example, the conductive lines 232a may route electrical signals in a direction in and out of the page from the perspective of FIG. 2. The conductive vias 232b may be arranged to route electrical signals in a direction of a plane that is substantially perpendicular to the surface of the substrate 210 upon which the device layer 220 is formed. In some embodiments, the conductive vias 232b may electrically couple conductive lines 232a of different metal layers 230 together.

A first metal layer 230-1 (referred to as Metal 1 or "M1") may be formed directly on the device layer 220. In some embodiments, the first metal layer 230-1 may include conductive lines 232a and/or conductive vias 232b, as shown. The conductive lines 232a of the first metal layer 230-1 may be coupled with contacts (e.g., the S/D contacts 228) of the device layer 220.

A second metal layer 230-2 (referred to as Metal 2 or "M2") may be formed directly on the first metal layer 230-1.

In some embodiments, the second metal layer 230-2 may include conductive vias 232b to couple the conductive lines 232a of the second metal layer 230-2 with the conductive lines 232a of the first metal layer 230-1. Although the conductive lines 232a and the conductive vias 232b are structurally delineated with a line within each metal layer (e.g., within the second metal layer 230-2) for the sake of clarity, the conductive lines 232a and the conductive vias 232b may be structurally and/or materially contiguous (e.g., simultaneously filled during a dual-damascene process) in some embodiments.

A third metal layer 230-3 (referred to as Metal 3 or "M3") (and additional metal layers, as desired) may be formed in succession on the second metal layer 230-2 according to similar techniques and configurations described in connection with the second metal layer 230-2 or the first metal layer 230-1.

The metal layers 230 may include a dielectric material 234 disposed between the interconnect structures 232, as shown in FIG. 2. The dielectric material 234 may take the form of any of the embodiments of the dielectric material provided between the interconnects of the IC structures disclosed herein, for example any of the embodiments discussed herein with reference to the insulating medium of the metallization stack 140. In some embodiments, the dielectric material 234 disposed between the interconnect structures 232 in different ones of the metal layers 230 may have different compositions. In other embodiments, the composition of the dielectric material 234 in different metal layers 230 may be the same.

The IC device 200 may include a solder resist material 236 (e.g., polyimide or similar material) and one or more conductive contacts 238 (e.g., bond pads) formed on the metal layers 230. The conductive contacts 238 may be electrically coupled with the interconnect structures 232 and configured to route the electrical signals of the transistor(s) 222 to other external devices. For example, solder bonds may be formed on the one or more conductive contacts 238 to mechanically and/or electrically couple a chip including the IC device 200 with another component (e.g., a circuit board). The IC device 200 may have other alternative configurations to route the electrical signals from the metal layers 230 than depicted in other embodiments. For example, the conductive contacts 238 illustrated in FIG. 2 as bond pads may be replaced by or may further include other analogous features (e.g., posts) that route the electrical signals to external components.

Any of the metal layers 230 and/or the device layer 220 may include one or more 3D interlocked corrugated capacitor structures. An example result of this is shown in FIG. 2 with a first 3D interlocked corrugated capacitor structure 250-1 in the first metal layer 230-1 and a second 3D interlocked corrugated capacitor structure 250-2 in the second metal layer 230-2. Although a particular number of 3D interlocked corrugated capacitor structures 250 is depicted in FIG. 2, embodiments of the present disclosure include IC devices having more or fewer 3D interlocked corrugated capacitor structures than depicted. The 3D interlocked corrugated capacitor structures 250 may be arranged within the metal layers 230 to serve as capacitors (e.g., decoupling capacitors) according to a wide variety of designs (in particular, the arrangement is not limited to the particular configuration of 3D interlocked corrugated capacitor structures 250 depicted in FIG. 2). In some embodiments, 3D interlocked corrugated capacitor structures 250 may be fabricated as MIM capacitors formed as part of the BEOL damascene processing. Although FIG. 2 illustrates individual 3D interlocked corrugated capacitor structures 250 in respective metal layers 230, in some embodiments, one or more of the 3D interlocked corrugated capacitor structures 250 may span multiple metal layers 230 (i.e., a single 3D interlocked corrugated capacitor structure 250 may extend vertically as to have portions in multiple metal layers 230). Furthermore, in some embodiments, one or more of the 3D interlocked corrugated capacitor structures 250 may span a device layer 220 and one or more metal layers 230 (i.e., a single 3D interlocked corrugated capacitor structure 250 may extend vertically as to have portions in the device layer 220 and in one or more metal layers 230 adjacent to the device layer 220).

FIGS. 3-10 illustrate cross-sectional side and top-down views of an example IC device during fabrication of 3D interlocked corrugated capacitor structures, according to some embodiments of the present disclosure. In each of FIGS. 3-10, a cross-sectional side view is the one showing an x-z plane of the coordinate system 105, while a top-down view is the one showing an x-y plane of the coordinate system 105, where the cross-sectional side view is the view across a AA plane shown in the top-down view and the top-down view is the view across a BB plane shown in the cross-sectional side view.

Fabrication of 3D interlocked corrugated capacitor structures may begin with providing an IC device with a support structure over which 3D interlocked corrugated capacitor structures may be formed, as well as a stack of three different materials in alternating layers. An example result of this is shown in FIG. 3, illustrating an IC device 303 that includes a support structure 320 and a stack 322 of a first material 324, a second material 324, and a third material 326.

The support structure 320 may be any suitable support over which 3D interlocked corrugated capacitor structures as described herein may be provided. In some embodiments, the support structure 320 may be the support structure 110, described above. In some embodiments, a device layer 120 as described above may be included in the support structure 320. In some embodiments, one or more metal layers 130 as described above may be included in the support structure 320.

Any suitable deposition technique may be used to provide the first material 324, the second material 326, and the third material 328 of the IC device 303, such as atomic level deposition (ALD), chemical vapor deposition (CVD), physical vapor deposition (PVD), spin-coating, dip-coating, etc. The stack 322 may be assembled according to the following considerations. Layers of the second material 326 and the third material 328 may be provided in an alternating manner, i.e., a layer of the second material 326 is provided in one layer above the support structure 320, a layer of the third material 328 is provided in another layer above the first layer, a layer of the second material 326 is provided in yet another layer above the second layer, and so on. Layers of the first material 324 are inserted between each pair of nearest layers of the second material 326 and the third material 328. For example, in some embodiments, the first layer of the stack 322 (i.e., the layer closest to the support structure 320) may be a layer of the first material 324, after which a layer of the second material 326 may be provided, then another layer of the first material 324, then a layer of the third material 328, then another layer of the first material 324, then another layer of the second material 326, and so on, as shown in FIG. 3. In other embodiments, the first layer of the stack 322 may be a layer of either the second material 326 or the third material 328.

Figure 3:
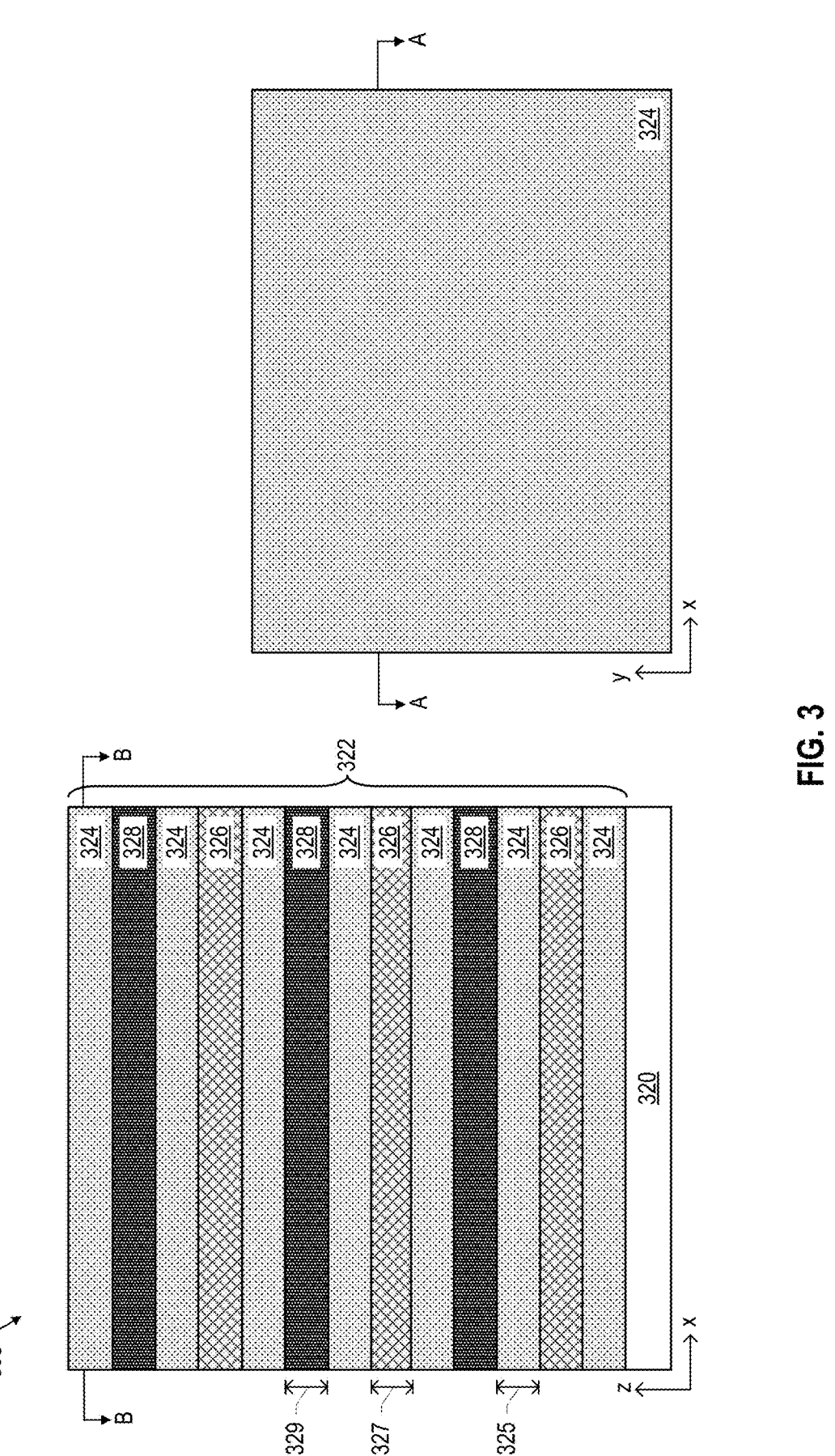
FIGS. 3-10 illustrate cross-sectional side and top-down views of an example IC device during fabrication of 3D interlocked corrugated capacitor structures, according to some embodiments of the present disclosure.
Figures 11, 12:
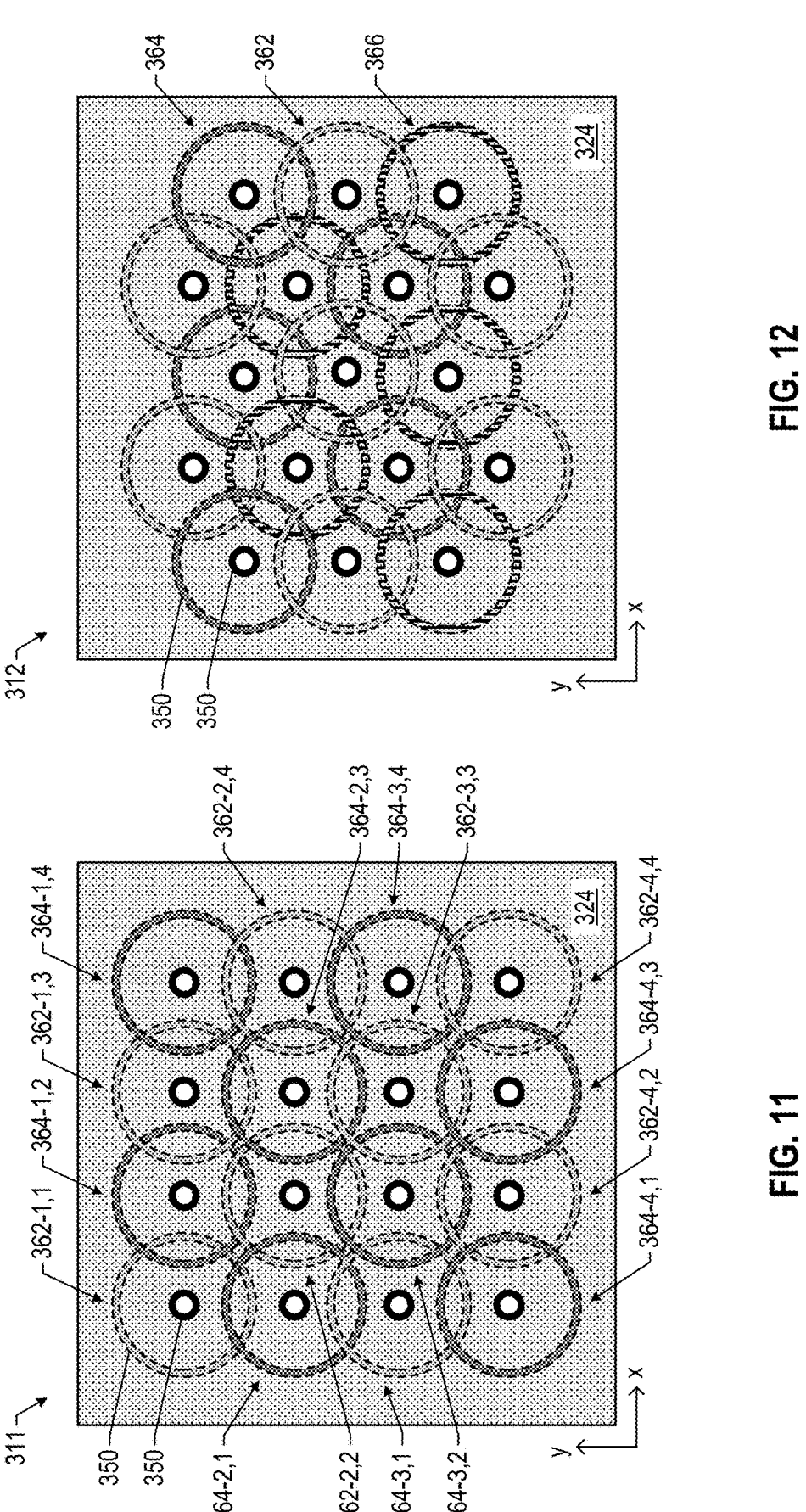
FIGS. 11-12 illustrate top-down views of alternative layouts of arrays of 3D interlocked corrugated capacitor structures, according to some embodiments of the present disclosure.

While FIG. 3 and subsequent drawings illustrate a particular number of the layers of the first material 324, the second material 326, and the third material 328 in the stack 322 (in particular, four sub-stacks of a layer of the first material 324, a layer of the second material 326, another layer of the first material 324, and the third material 328; plus another layer of the first material 324 over the fourth stack), in other embodiments, the number of the sub-stacks and the arrangement of the individual layers in any given sub-stack may be different. As will become clear from the following descriptions, layers of the second material 326 will serve as basis for forming horizontal protrusions of one or more first corrugated capacitor structures, while layers of the third material 328 will serve as basis for forming horizontal protrusions of one or more second corrugated capacitor structures. Because the layers of the second material 326 and the third material 328 are in different planes above the support structure 320, such protrusions may interlock with one another, thus realizing an IC device with 3D interlocked corrugated capacitor structures. Therefore, the exact number of the layers of the first material 324, the second material 326, and the third material 328 in the stack 322 would depend on how many protrusions a given corrugated capacitor structure should have. Furthermore, in other embodiments, more than two corrugated capacitor structures may be interlocked with one another as long as the protrusions of different sets of corrugated capacitor structures are in different planes above the support structure 320; one example of this is shown in FIG. 12 and described below, where three sets of corrugated capacitor structures are arranged in a honeycomb arrangement.

The first material 324, the second material 326, and the second material 326 have different material compositions so that the second material 326 has sufficient etch selectivity with respect to each of the first material 324 and the third material 328, and the third material 328 has sufficient etch selectivity with respect to each of the first material 324 and the second material 326. As known in the art, two materials are said to have "sufficient etch selectivity" when etchants used to etch one material do not substantially etch the other, enabling selective etching of one material but not the other. Besides appropriate etching characteristics, some other considerations in selecting suitable materials for the first material 324, the second material 326, and the third material 328 may include, e.g., possibilities of smooth film formation, and low shrinkage and outgassing.

In some embodiments, the first material 324, the second material 326, and the third material 328 may include different insulator materials. In some embodiments, any of the first material 324, the second material 326, and the third material 328 may be a low-k dielectric material. Examples of the low-k dielectric materials that may be used in any of the first material 324, the second material 326, and the third material 328 include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used in any of the first material 324, the second material 326, and the third material 328 include organic polymers such as polyimide, polynorbornenes, benzocyclobutene, perfluorocyclobutane, or polytetrafluoroethylene (PTFE). Still other examples of low-k dielectric materials that may be used in any of the first material 324, the second material 326, and the third material 328 include silicon-based polymeric dielectrics such as hydrogen silsesquioxane (HSQ) and methylsilsesquioxane (MSQ). In some embodiments, any of the first material 324, the second material 326, and the third material 328 may include any ILD materials described herein. In some embodiments, any of the first material 324, the second material 326, and the third material 328 may include any suitable semiconductor material together with oxygen (i.e., any of the first material 324, the second material 326, and the third material 328 may be an oxide of a semiconductor material) or together with nitrogen (i.e., any of the first material 324, the second material 326, and the third material 328 may be a nitride of a semiconductor material), or together with oxygen and nitrogen (i.e., any of the first material 324, the second material 326, and the third material 328 may be an oxynitride of a semiconductor material).

In some embodiments, a thickness 325 of an individual layer of the first material 324 (i.e., a dimension measured along the z-axis of the coordinate system 105) may be between about 10 nanometers and 1000 nanometers, including all ranges and values therein, e.g., between about 20 nanometers and 750 nanometers or between about 25 nanometers and 250 nanometers. In some embodiments, a thickness 327 of an individual layer of the second material 326 and a thickness 328 of an individual layer of the third material 328 (i.e., also dimensions measured along the z-axis of the coordinate system 105) may be in substantially the same ranges as those described for the thickness 325. Although FIG. 3 illustrates all of the first material 324, the second material 326, and the third material 328 to be of about the same thickness, this may be different in other embodiments. In general, any layers of any of the first material 324, the second material 326, and the third material 328 may have the same or different thicknesses compared to any other layers.

Figure 4:
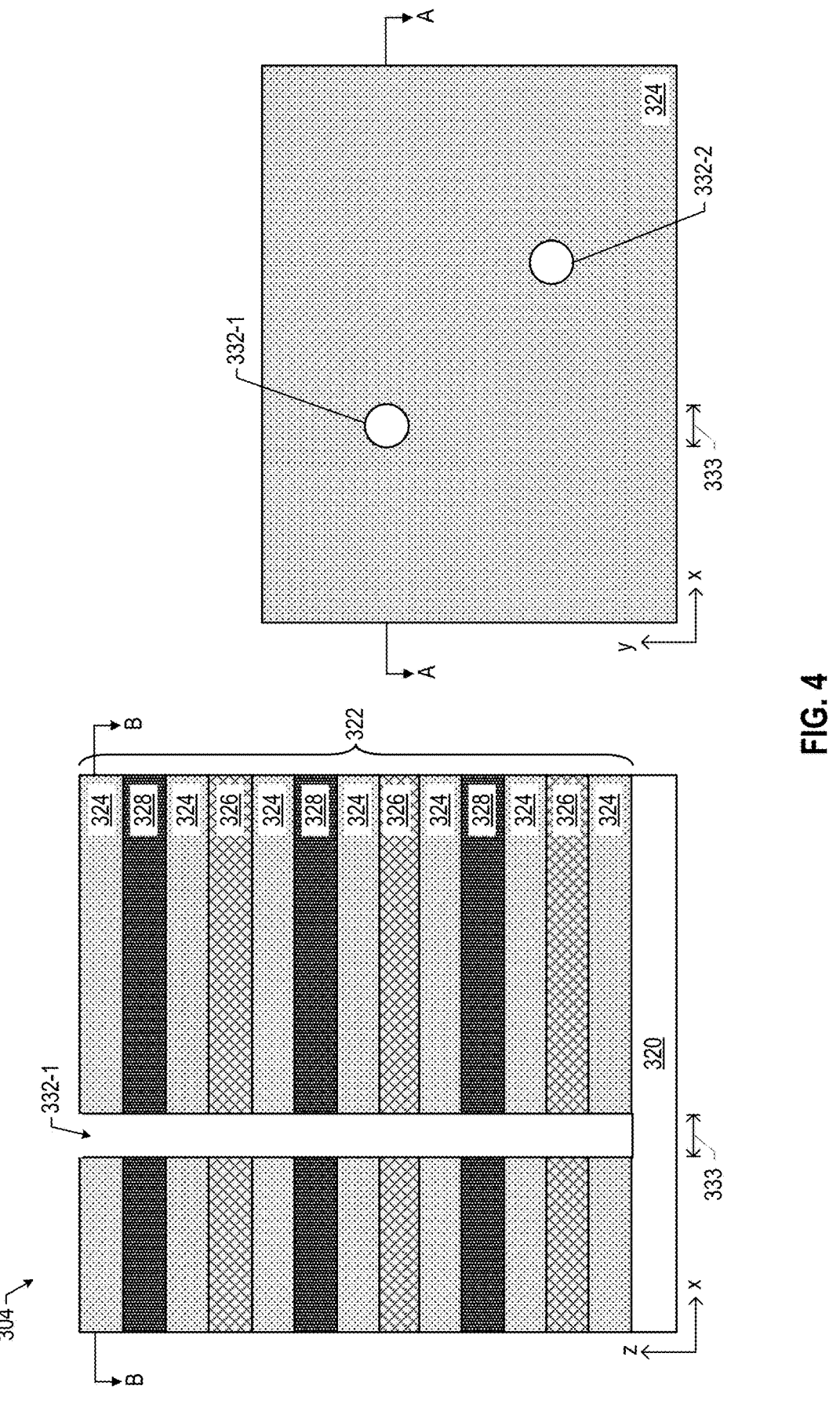

The fabrication method may then continue with patterning the stack of the IC device 303 to form one or more openings extending through the stack to the support structure. An example result of this is shown in FIG. 4, illustrating an IC device 304 that includes a first opening 332-1 and a second opening 332-2 (which, together, may be referred to as "openings 332"), each extending from the top of the stack 322 to the support structure 320. FIG. 4 and subsequent drawings illustrate cross-sectional side views only across the opening 332-1, but explanations provided with respect to the opening 332-1 and further processing steps applied to the opening 332-1 are equally applicable to the opening 332-2 and any further openings 332 that may be present in the IC device 304. Although two openings 332 are shown in FIG. 4, in other embodiments, only one of the openings 332 may be present in the IC device 304. Alternatively, in other embodiments, more than two openings 332 may be present, e.g., as discussed with reference to FIGS. 11-12.

Any suitable patterning techniques may be used to pattern the stack 322 to form one or more openings 332 of the IC device 304, such as, but not limited to, photolithographic or electron-beam (e-beam) patterning, possibly in conjunction with a suitable etching technique, e.g., a dry etch, such as e.g., radio frequency (RF) reactive ion etch (RIE) or inductively coupled plasma (ICP) RIE. In some embodiments, the etch performed in a patterning process may include an anisotropic etch, using etchants in a form of, e.g., chemically active ionized gas (i.e., plasma) using e.g., bromine (Br) and chloride (CI) based chemistries. In some embodiments, during the etch of a patterning process, the IC structure may be heated to elevated temperatures, e.g., to temperatures between about room temperature and 200 degrees Celsius, including all values and ranges therein, to promote that byproducts of the etch are made sufficiently volatile to be removed from the surface.

In some embodiments, the openings 332 may be vias, as shown in FIG. 4. Although not specifically shown in FIG. 4, cross-sectional side views of any of the openings 332 may have a tapered shape, where a width 333 (i.e., a dimension measured along the x-axis of the coordinate system 105) of the openings 332 may decrease, e.g., gradually, from the top of the stack 322 (i.e., from the portion of the stack 322 that is farthest away from the support structure 320) to the bottom of the stack (i.e., the portion of the stack 322 that is closest to the support structure 320). In some embodiments, the width 333 may be between about 10 nanometer and 500 nanometers, including all ranges and values therein, e.g., between about 10 nanometers and 250 nanometers or between about 20 nanometers and 100 nanometers.

Figure 5:
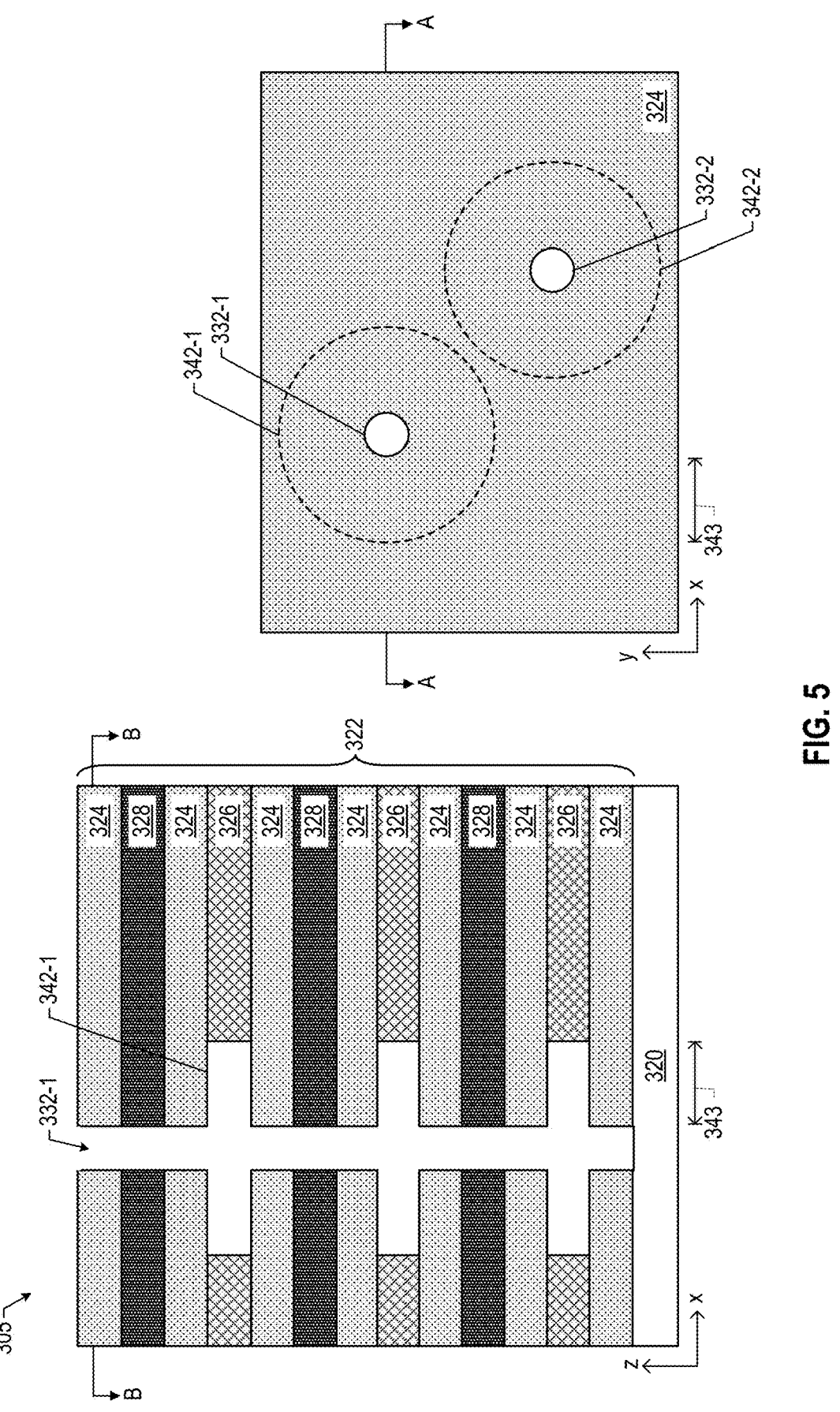

Next, the openings 332 may be used as access points for etchants to etch portions of the second material 326 that cross the openings 332, thus forming protrusions in the second material 326, the protrusions extending away from the openings 332. An example result of this is shown in FIG. 5, illustrating an IC device 305 that is substantially the same as the IC device 304 but where protrusions 342 are formed, where the protrusions 342 are portions of the second material 326 extending away from the openings 332 by a distance 343 (i.e., a dimension measured in the x-y plane of the coordinate system 105). In some embodiments, the distance 343 may be between about 10 nanometer and 500 nanometers, including all ranges and values therein, e.g., between about 10 nanometers and 250 nanometers or between about 20 nanometers and 100 nanometers. Any suitable etching technique that would allow providing etchants via the opening 332-1 to etch the second material 326 in directions away from the opening 332-1 may be used for this purpose. In some embodiments, the etch performed to form the protrusions 342 may be a timed etch, where the time, together with the type of etchants used, would determine the distance 343. Because the second material 326 has sufficient etch selectivity with respect to each of the first material 324 and the third material 328, the etch process to form the protrusions 342 in the second material 326 does not substantially remove any of the first material 324 and the third material 328.

In some embodiments, an isotropic etch, such as a wet etch, may be used to form the protrusions 342. Because an isotropic etch has substantially the same etch rate in all directions, protrusions 342 may be substantially circular in their x-y plane top-down cross-sections, which can be seen in the top-down view shown in FIG. 5 where a first set of protrusions 342-1 is formed around the first opening 332-1 and a second set of protrusions 342-2 is formed around the second opening 332-2 (which, together, may be referred to as "protrusions 342"). Because the protrusions 342 are formed by removing portions of the second material 326 nearest the openings 332, the protrusions extend away from the openings 332 substantially horizontally (because the layers of the second material 326 are horizontal, i.e., parallel to the support structure 320) and may be shaped as rings around their respective openings 332. The protrusions 342 are illustrated in the top-down view of FIG. 5 and subsequent drawings with dashed contours to indicate that they are actually below the plane BB along which the cross-section is taken to show the top-down view. The cross-sectional side view of FIG. 5 illustrates how the protrusions 342 are formed in each of the layers of the second material 326 that crosses the opening 332-1.

Figure 6:
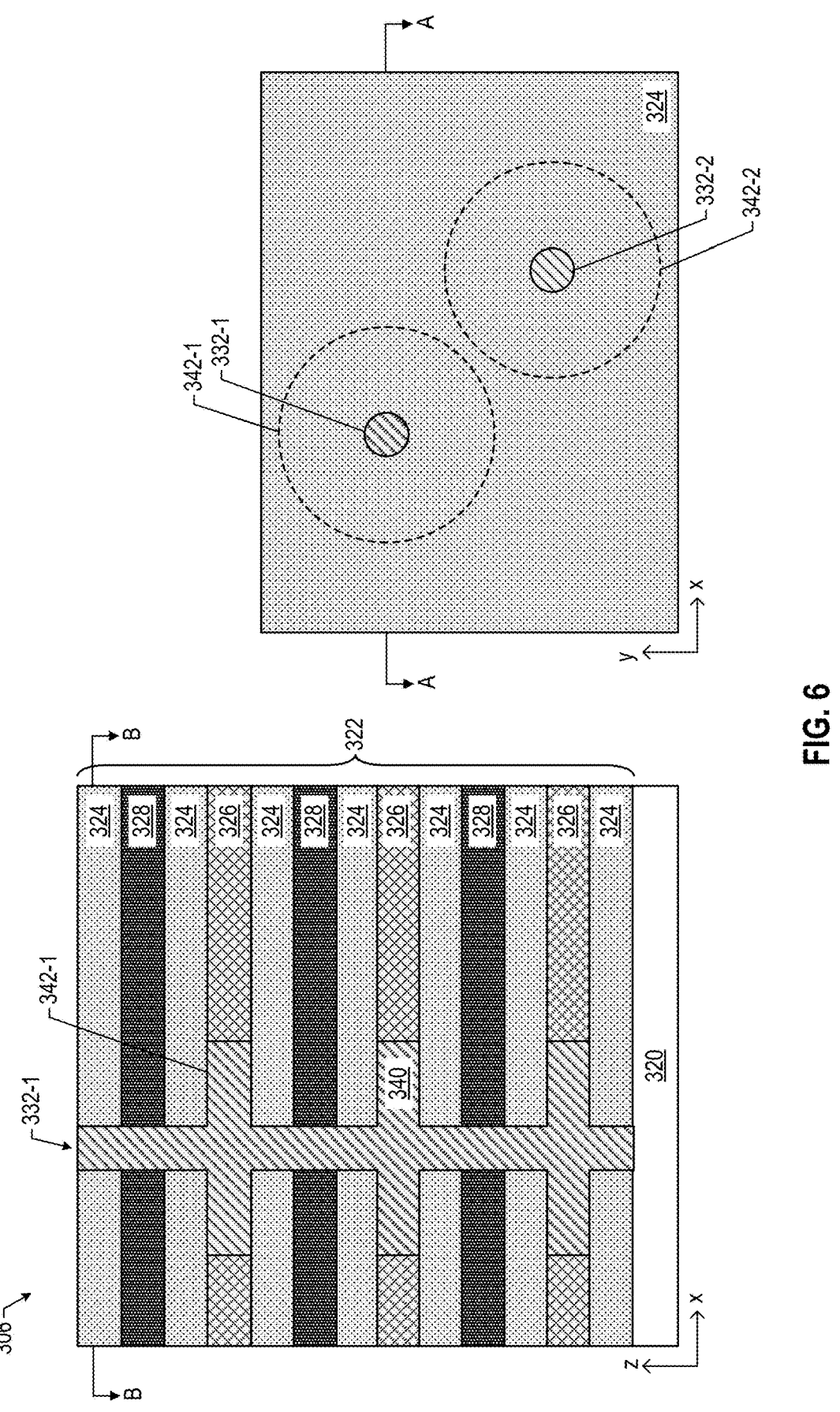

The fabrication method may then continue with filling the openings 332 and the protrusions 342 extending therefrom with a plug material. An example result of this is shown in FIG. 6, illustrating an IC device 306 that is substantially the same as the IC device 305 but where the openings 332 and the protrusions 342 extending therefrom with a plug material 340. The plug material 340 may include any suitable material that has sufficient etch selectivity with respect to the third material 328, so that when the third material 328 is etched in a later fabrication process via another set of one or more openings, the 340 is not etched and, subsequently, portions of the third material 328 that cross the openings 332 are not etched. Furthermore, the plug material 340 may include any suitable material that also has sufficient etch selectivity with respect to the first material 324 and the second material 326, so that when the plug material 340 is removed in a later fabrication process, the first material 324 and the second material 326 are not etched. In some embodiments, the plug material 340 may include any of the insulator materials described herein. In other embodiments, the plug material 340 may include a semiconductor material or an electrically conductive material, as the conductivity properties of the plug material 340 are not significant for how it is used because eventually it will be removed.

Figure 7:
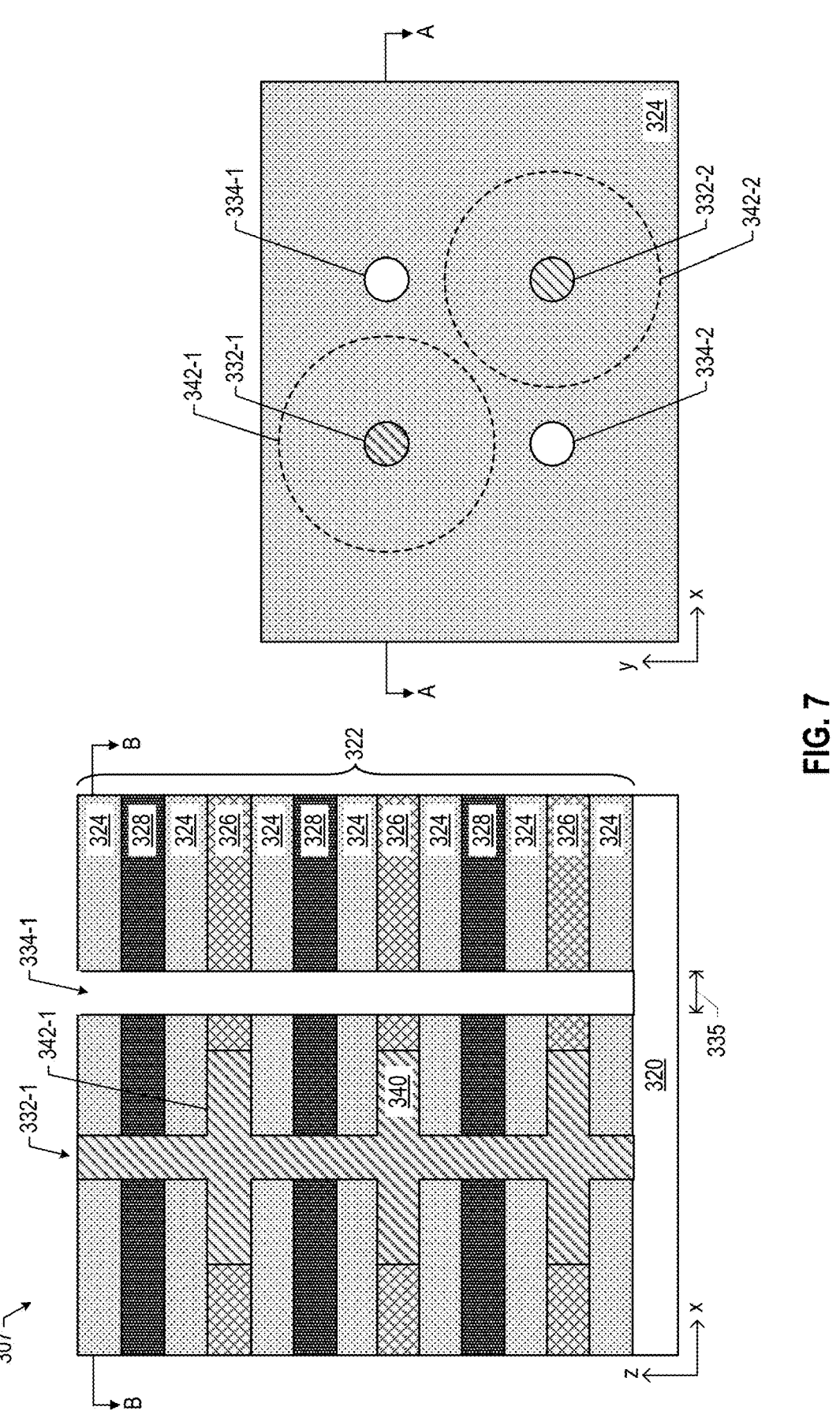

Next, the fabrication method may include patterning the stack of the IC device 306 to form one or more further openings extending through the stack to the support structure. An example result of this is shown in FIG. 7, illustrating an IC device 307 that is substantially the same as the IC device 306 except that it further includes a first opening 334-1 and a second opening 334-2 (which, together, may be referred to as "openings 334"), each extending from the top of the stack 322 to the support structure 320. FIG. 7 and subsequent drawings illustrate cross-sectional side views only across the opening 334-1, but explanations provided with respect to the opening 334-1 and further processing steps applied to the opening 334-1 are equally applicable to the opening 334-2 and any further openings 334 that may be present in the IC device 307. Although two openings 334 are shown in FIG. 7, in other embodiments, only one of the openings 334 may be present in the IC device 307. Alternatively, in other embodiments, more than two openings 334 may be present, e.g., as discussed with reference to FIGS. 11-12.

Any suitable patterning techniques may be used to pattern the stack 322 to form one or more further openings 334 of the IC device 307, such as those described above with reference to forming one or more openings 332. Similar to the openings 332, in some embodiments, the openings 334 may be vias, as shown in FIG. 7. Although not specifically shown in FIG. 7, cross-sectional side views of any of the openings 334 may have a tapered shape, where a width 335 (i.e., a dimension measured along the x-axis of the coordinate system 105) of the openings 334 may decrease, e.g., gradually, from the top of the stack 322 to the bottom of the stack 322. In some embodiments, the width 335 may be in substantially the same ranges as those provided for the width 333, although, in general, the width 335 does not have to be equal to the width 333.

Figure 8:
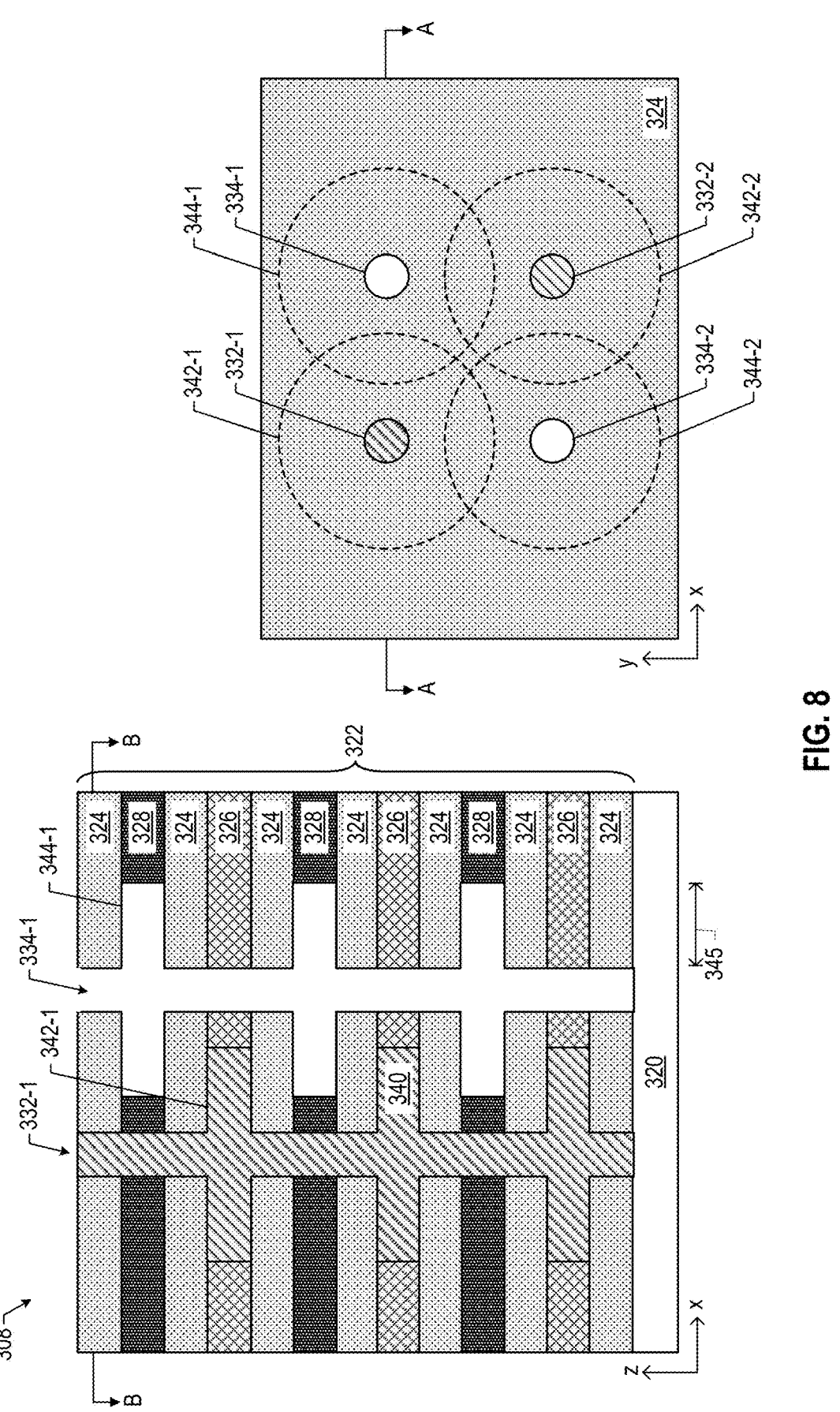

Next, the openings 334 may be used as access points for etchants to etch portions of the third material 328 that cross the openings 334, thus forming protrusions in the third material 328, the protrusions extending away from the openings 334. An example result of this is shown in FIG. 8, illustrating an IC device 308 that is substantially the same as the IC device 307 but where protrusions 344 are formed, where the protrusions 344 are portions of the third material 328 extending away from the openings 334 by a distance 345 (i.e., a dimension measured in the x-y plane of the coordinate system 105). In some embodiments, the distance 345 may be between about 10 nanometer and 500 nanometers, including all ranges and values therein, e.g., between about 10 nanometers and 250 nanometers or between about 20 nanometers and 100 nanometers. Any suitable etching technique that would allow providing etchants via the opening 334-1 to etch the third material 328 in directions away from the opening 334-1 may be used for this purpose. In some embodiments, the etch performed to form the protrusions 344 may be a timed etch, where the time, together with the type of etchants used, would determine the distance 345. Because the third material 328 has sufficient etch selectivity with respect to each of the first material 324 and the second material 326, the etch process to form the protrusions 344 in the third material 328 does not substantially remove any of the first material 324 and the second material 326.

In some embodiments, an isotropic etch, such as a wet etch, may be used to form the protrusions 344. Because an isotropic etch has substantially the same etch rate in all directions, protrusions 344 may be substantially circular in their x-y plane top-down cross-sections, which can be seen in the top-down view shown in FIG. 8 where a first set of protrusions 344-1 is formed around the first opening 334-1 and a second set of protrusions 344-2 is formed around the second opening 334-2 (which, together, may be referred to as "protrusions 344"). Because the protrusions 344 are formed by removing portions of the third material 328 nearest the openings 334, the protrusions 344 extend away from the openings 334 substantially horizontally (because the layers of the third material 328 are horizontal, i.e., parallel to the support structure 320) and may be shaped as rings around their respective openings 334. Similar to the protrusions 342, the protrusions 344 are illustrated in the top-down view of FIG. 8 and subsequent drawings with dashed contours to indicate that they are actually below the plane BB along which the cross-section is taken to show the top-down view. The cross-sectional side view of FIG. 8 illustrates how the protrusions 344 are formed in each of the layers of the third material 328 that crosses the opening 334-1.

Figure 9:
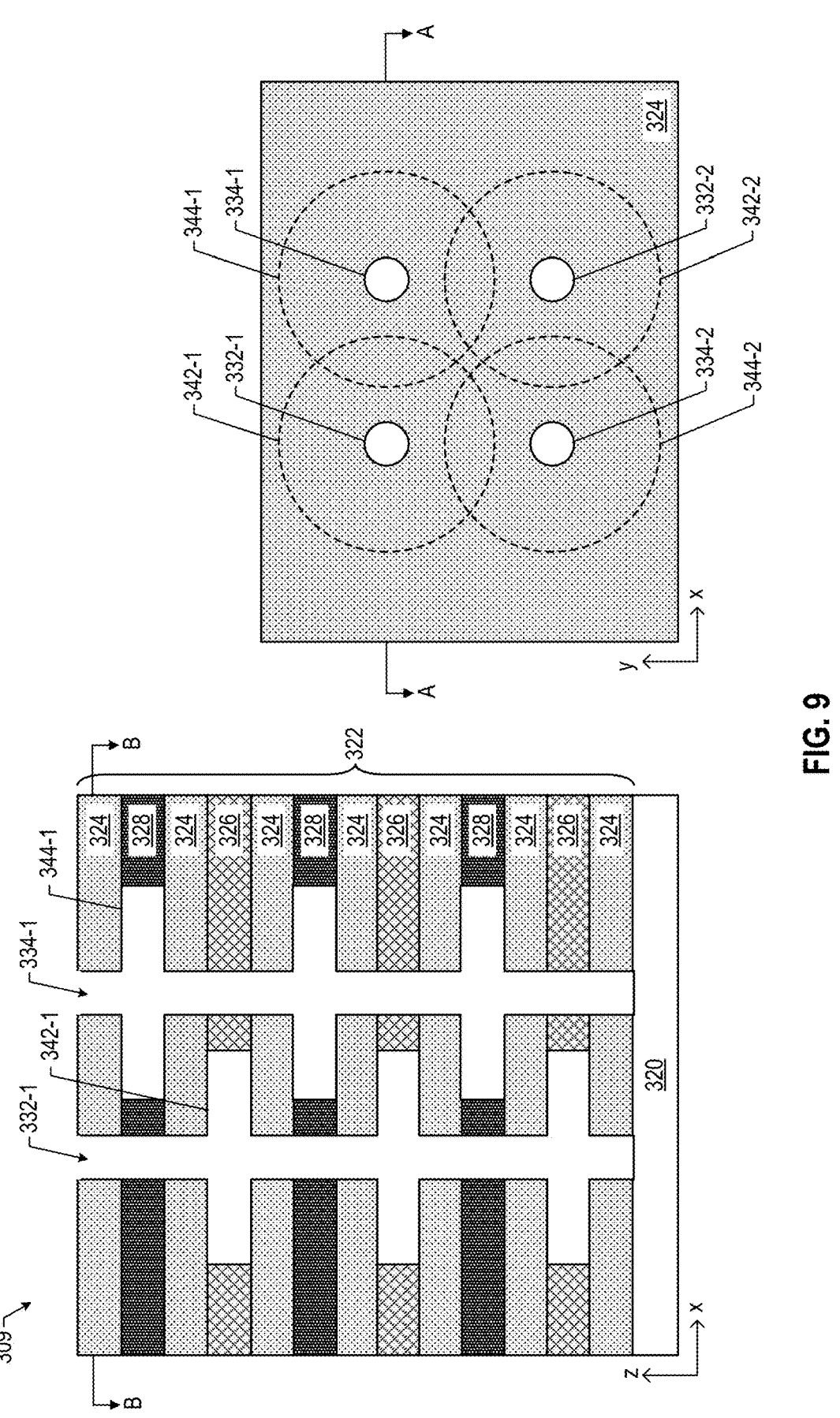

The fabrication method may then continue with removing the plug material 340 that was filling the openings 332. An example result of this is shown in FIG. 9, illustrating an IC device 309 that is substantially the same as the IC device 308 but where the plug material 340 is no longer present in the openings 332 and the protrusions 342 extending therefrom. In some embodiments, an isotropic etch, such as a wet etch, may be used to remove the plug material 340. Because the plug material 340 has sufficient etch selectivity with respect to each of the first material 324, the second material 326, and the third material 328, the etchants used to remove the plug material 340 do not substantially remove any of the first material 324, the second material 326, and the third material 328.

Figure 10:
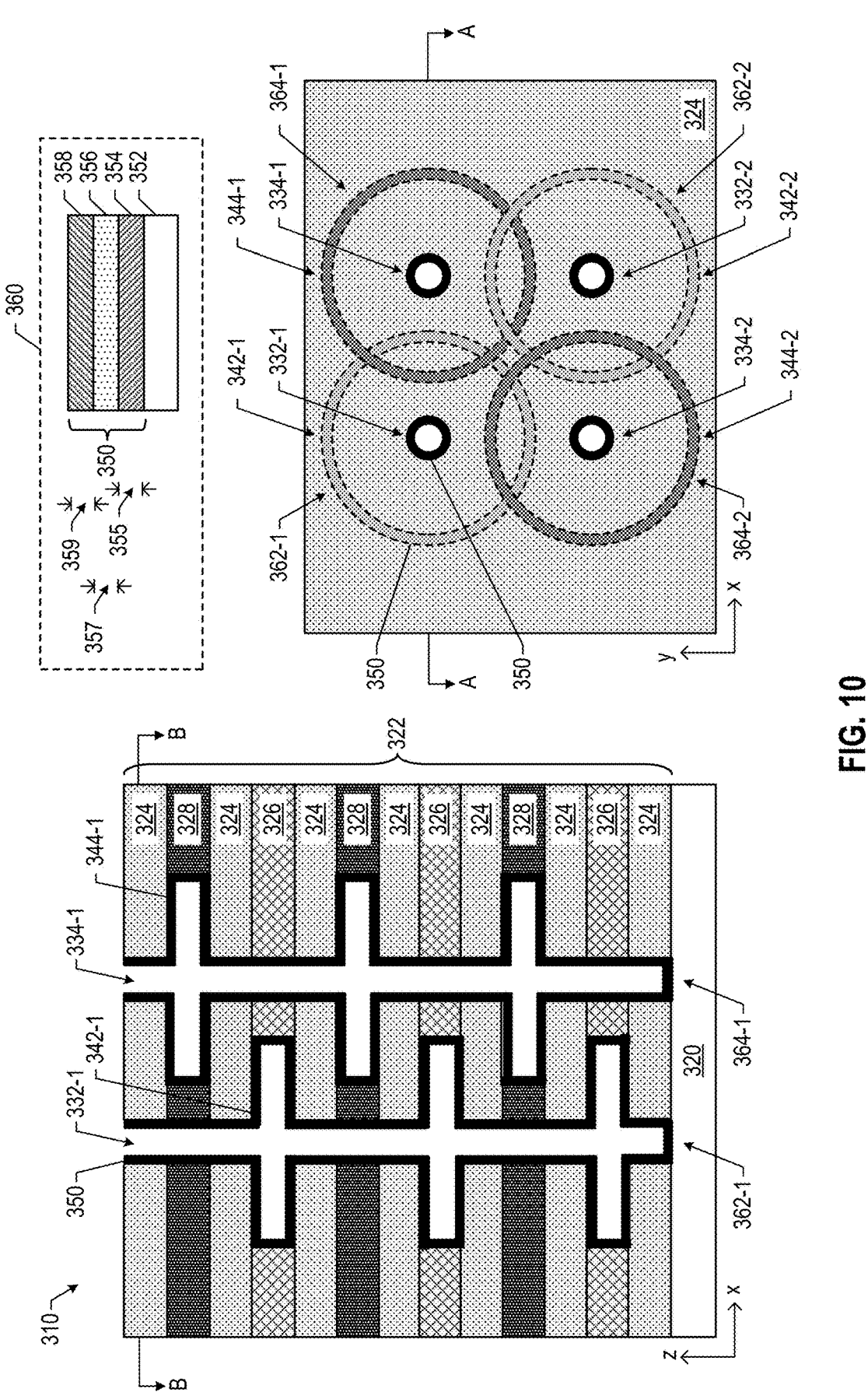

The fabrication method may further include providing a capacitor stack lining the walls of the openings 332 and the protrusions 342 extending therefrom, as well as lining the walls of the openings 334 and the protrusions 344 extending therefrom. An example result of this is shown in FIG. 10, illustrating an IC device 310 that is substantially the same as the IC device 309 but where a capacitor stack 350 is provided on all inner sidewalls of the openings 332 and the protrusions 342, and on all inner sidewalls of the openings 334 and the protrusions 344. An inset 360 is shown in FIG. 10, illustrating the details of the capacitor stack 350 with respect to a wall 352, where the wall 352 may be any wall of the openings 332, the protrusions 342, the openings 334, and the protrusions 344. As shown in the inset 360, the capacitor stack 350 may include a first electrically conductive material 354 and a second electrically conductive material 358 separated by a capacitor insulator 356. The first electrically conductive material 354 may be deposited conformal to the wall 352, the capacitor insulator 356 may be deposited conformal to the first electrically conductive material 354, and the second electrically conductive material 358 may be deposited conformal to the capacitor insulator 356. Thus, the first electrically conductive material 354 may be closest to the wall 352, compared to the capacitor insulator 356 and the second electrically conductive material 358.

In some embodiments, any of the first electrically conductive material 354 and the 358 may include any conductive metals, e.g., Cu, Al, W, or Co, or metal alloys. In some embodiments, a thickness 355 of the first electrically conductive material 354 (i.e., a dimension measured along a direction perpendicular to the wall 352) may be between about 1 nanometer and 100 nanometers, including all ranges and values therein, e.g., between about 2 nanometers and 75 nanometers or between about 5 nanometers and 50 nanometers. In some embodiments, a thickness 359 of the second electrically conductive material 358 (i.e., also a dimension measured along a direction perpendicular to the wall 352) may be in the same ranges as the thickness 355. In various embodiments, the thickness 355 and the thickness 359 may, but do not have to, be the same. In some embodiments, the capacitor insulator 356 may include any of the insulator materials described herein. In some embodiments, the capacitor insulator 356 may include a high-k dielectric material, e.g., any of the high-k dielectric material described with reference to the gate dielectric of the transistor 222 shown in FIG. 2. In some embodiments, a thickness 357 of the capacitor insulator 356 may be between about 1 nanometer and 20 nanometers, including all ranges and values therein, e.g., between about 1 nanometer and 10 nanometers or between about 2 nanometers and 5 nanometers. Any suitable deposition technique may be used to provide the different layers of the capacitor stack 350 of the IC device 310, e.g., ALD, CVD, or PVD.

The capacitor stacks 350 on the walls of the first set of openings 332 and the corresponding protrusions 342 extending therefrom provide a first set of corrugated capacitor structures 362, individually labeled in FIG. 10 as a first corrugated capacitor structure 362-1 and a second corrugated capacitor structure 362-2 (which, together, may be referred to as "corrugated capacitor structures 362"). Thus, each of the openings 332 with the associated protrusions 342 extending therefrom form a respective corrugated capacitor structure 362 of the first set, where the IC device 310 may include so many corrugated capacitor structures 362 in the first set as there are openings 332. Similarly, the capacitor stacks 350 on the walls of the second set of openings 334 and the corresponding protrusions 344 extending therefrom provide a second set of corrugated capacitor structures 364, individually labeled in FIG. 10 as a first corrugated capacitor structure 364-1 and a second corrugated capacitor structure 364-2 (which, together, may be referred to as "corrugated capacitor structures 364"). Thus, each of the openings 334 with the associated protrusions 344 extending therefrom form a respective corrugated capacitor structure 364 of the second set, where the IC device 310 may include so many corrugated capacitor structures 364 in the second set as there are openings 334.

The top-down view of FIG. 10 illustrates rings associated with the portions of the capacitor stacks 350 at the outermost portions of the protrusions 342. For example, for the protrusion 342-1, the ring illustrates a portion of the capacitor stack 350 between the second material 326 and the opening 332-1; for the protrusion 344-1, the ring illustrates a portion of the capacitor stack 350 between the third material 328 and the opening 334-1, and so on. The rings of the capacitor stacks 350 at the outermost portions of the protrusions 342 are illustrated in the top-down view of FIG. 10 with dashed contours to indicate that they are actually below the plane BB along which the cross-section is taken to show the top-down view. On the other hand, the capacitor stacks 350 near the top of the openings 332, 334 are shown in the top-down view of FIG. 10 with the same pattern as in the cross-sectional side view of FIG. 10, because these portions of the capacitor stacks 350 are visible in the plane BB along which the cross-section is taken to show the top-down view. In the top-down view of FIG. 10, rings of different shades/patterns illustrate the protrusions 342 that are at different levels above the support structure 320.

The top-down view of FIG. 10 illustrates how the protrusions 342 of some of the corrugated capacitor structures 362 may be interlocked with the protrusions 344 of the neighboring ones of the corrugated capacitor structures 364. For example, as shown in the top-down view of FIG. 10, the protrusions 342-1 may be interlocked with the protrusions 344-1 on one side of the corrugated capacitor structure 362-1 and may further be interlocked with the protrusions 344-2 on another side of the corrugated capacitor structure 362-1. Because the protrusions 342-1 are in different layers above the support structure 320 than the protrusions 344-1 and the protrusions 344-2 and are separated from the protrusions 344-1 and the protrusions 344-2 by respective layers of the first material 324, the corrugated capacitor structure 362-1 is electrically isolated from the corrugated capacitor structure 364-1 and the corrugated capacitor structure 364-2. In another example, as also shown in the top-down view of FIG. 10, the protrusions 344-1 may be interlocked with the protrusions 342-1 on one side of the corrugated capacitor structure 364-1 and may further be interlocked with the protrusions 342-2 on another side of the corrugated capacitor structure 364-1. Because the protrusions 344-1 are in different layers above the support structure 320 than the protrusions 342-1 and the protrusions 342-2 and are separated from the protrusions 342-1 and the protrusions 342-2 by respective layers of the first material 324, the corrugated capacitor structure 364-1 is electrically isolated from the corrugated capacitor structure 362-1 and the corrugated capacitor structure 362-2. In this manner, for a given aspect ratio, 3D interlocked corrugated capacitor structures such as the interlocked corrugated capacitor structures 362 and 364 provide more surface area for the capacitor stacks 350 per unit area of the support structure 320, enabling higher capacitance per unit area. In some embodiments, the interlocking may be such that at least about 10% of a projection of at least one of the protrusions 342 of one of the first corrugated capacitor structures 362 onto a plane parallel to the support structure 320 may overlap with an analogous projection of at least one of the protrusions 344 of one of the second corrugated capacitor structures 364, e.g., at least about 20%, at least about 30%, or between about 25% and 55%.

Different ones of the 3D interlocked corrugated capacitor structures 362 and 364 may be different examples of any of the 3D interlocked corrugated capacitor structures 250 of FIG. 2. Although not specifically shown in the present drawings, the fabrication method may further include patterning contacts to first and second capacitor electrodes of the 3D interlocked corrugated capacitor structures 362 and 364. Any suitable patterning techniques may be used to form such contacts, and any suitable routing geometry of the contacts may be used, all of which being within the scope of the present disclosure.

While FIG. 10 illustrates an example of an IC device 310 where two sets of corrugated capacitor structures (i.e., the corrugated capacitor structures 362 and 364) are interlocked with one another and there are in total four corrugated capacitor structures interlocked with one another, descriptions provided herein may easily be extended to many other topologies, all of which being within the scope of the present disclosure. For example, FIGS. 11-12 illustrate top-down views of alternative layouts of arrays of 3D interlocked corrugated capacitor structures, according to some embodiments of the present disclosure. The same notation as described above for the top-down view of FIG. 10 is used for the top-down views of FIGS. 11-12.

FIG. 11 an IC device 311 similar to the IC device 310, but where two sets of corrugated capacitor structures, e.g., corrugated capacitor structures 362 and 364 as described above, may be arranged in a two-dimensional array. An example 4×4 array of corrugated capacitor structures is shown in FIG. 11, but, in general, the IC device 311 may include any array of N×M corrugated capacitor structures where each of N and M is an integer and at least one of them is greater than 1. In the example 4×4 array shown in FIG. 11, some of the individual corrugated capacitor structures 362 and 364 are labeled with two integers, separated by a comma, after a dash, where the first integer indicates a row in which a given corrugated capacitor structure is located (different rows being at different locations along the y-axis of the coordinate system 105) and the second integer indicates a column in which a given corrugated capacitor structure is located (different columns being at different locations along the x-axis of the coordinate system 105). For example, a corrugated capacitor structure 362-1,1 is an example of a corrugated capacitor structure 362 as described above that is located in row 1 and column 1 of the array, a corrugated capacitor structure 364-1,2 is an example of a corrugated capacitor structure 364 as described above that is located in row 1 and column 2 of the array, a corrugated capacitor structure 362-1,3 is an example of a corrugated capacitor structure 362 as described above that is located in row 1 and column 3 of the array, and so on. In FIG. 11, some of the corrugated capacitor structures 362, 364 are at the periphery of the array and some of the corrugated capacitor structures 362, 364 are within the periphery of the array. A corrugated capacitor structure is said to be "at the periphery" of an array if it has less nearest neighbors than at least one other corrugated capacitor structure that is then said to be "within the periphery" of an array. FIG. 11 illustrates that, with a rectangular arrangement of the corrugated capacitor structures 362, 364 in an array, individual ones of those corrugated capacitor structures 362 that are within the periphery of the array may have four nearest neighbors corrugated capacitor structures 364 (i.e., with the protrusions in different planes, corrugated capacitor structures 362) with which they interlock protrusions as described herein. For example, for the corrugated capacitor structure 362-2,2, the four nearest neighbors with which the corrugated capacitor structure 362-2,2 has interlocked protrusions are corrugated capacitor structure 364-1,2, corrugated capacitor structure 364-2,3, corrugated capacitor structure 364-3,2, and corrugated capacitor structure 364-2,1. In another example, for the corrugated capacitor structure 362-3,3, the four nearest neighbors with which the corrugated capacitor structure 362-3,3 has interlocked protrusions are corrugated capacitor structure 364-2,3, corrugated capacitor structure 364-3,4, corrugated capacitor structure 364-4,3, and corrugated capacitor structure 364-3,2. Similarly, FIG. 11 illustrates that, with a rectangular arrangement of the corrugated capacitor structures 362, 364 in an array, individual ones of those corrugated capacitor structures 364 that are within the periphery of the array may have four nearest neighbors corrugated capacitor structures 362 (i.e., again, with the protrusions in different planes, now compared with the corrugated capacitor structures 364) with which they interlock protrusions as described herein. For example, for the corrugated capacitor structure 364-2,3, the four nearest neighbors with which the corrugated capacitor structure 364-2,3 has interlocked protrusions are corrugated capacitor structure 362-1,3, corrugated capacitor structure 362-2,4, corrugated capacitor structure 362-3,3, and corrugated capacitor structure 362-2,2. In another example, for the corrugated capacitor structure 364-3,2, the four nearest neighbors with which the corrugated capacitor structure 364-3,2 has interlocked protrusions are corrugated capacitor structure 362-2,2, corrugated capacitor structure 362-3,3, corrugated capacitor structure 362-4,2, and corrugated capacitor structure 362-3,1.

FIG. 12 an IC device 312 similar to the IC device 310, but where three sets of corrugated capacitor structures, e.g., corrugated capacitor structures 362 and 364 as described above and corrugated capacitor structures 366, may be arranged in a honeycomb (hexagonal) array. Each of the corrugated capacitor structures 366 may be implemented as described above with reference to the corrugated capacitor structures 362 and 364, but may have protrusions at different levels with respect to the support structure 320 compared to the protrusions 342 and 344. Correspondingly, the stack 322 of the IC device 312 would further include layers of a fourth material arranged at different levels than the layers of the second material 326 and the third material 328, and would be separated from the nearest ones of the second material 326 or the third material 328 or another layer of the fourth material by a layer of the first material 324. In other embodiments, the IC device 312 may include different numbers of the corrugated capacitor structures 362, 364, and 366. In still further embodiments, the IC device 312 may include more than three sets of corrugated capacitor structures with protrusions in different layers per set. FIG. 12 illustrates that, with a honeycomb arrangement of the corrugated capacitor structures 362, 364, 366 in an array, individual ones of those corrugated capacitor structures 362 that are within the periphery of the array may have three nearest neighbors corrugated capacitor structures 364 (i.e., with the protrusions in different planes compared with the corrugated capacitor structures 362 and 366) and three nearest neighbors corrugated capacitor structures 366 (i.e., with the protrusions in different planes compared with the corrugated capacitor structures 362 and 364) with which they interlock protrusions as described herein. Similarly, individual ones of those corrugated capacitor structures 364 that are within the periphery of the array may have three nearest neighbors corrugated capacitor structures 362 (i.e., with the protrusions in different planes compared with the corrugated capacitor structures 364 and 366) and three nearest neighbors corrugated capacitor structures 366 (i.e., with the protrusions in different planes compared with the corrugated capacitor structures 364 and 362) with which they interlock protrusions as described herein. Furthermore, individual ones of those corrugated capacitor structures 366 that are within the periphery of the array may have three nearest neighbors corrugated capacitor structures 362 (i.e., with the protrusions in different planes compared with the corrugated capacitor structures 366 and 364) and three nearest neighbors corrugated capacitor structures 364 (i.e., with the protrusions in different planes compared with the corrugated capacitor structures 366 and 362) with which they interlock protrusions as described herein. Thus, with a honeycomb arrangement, each of the corrugated capacitor structures 362/364/366 that are within the periphery of the array may have a total of six nearest neighbors corrugated capacitor structures with protrusions at other levels than the one at the center of the six nearest neighbors. Such an arrangement may, advantageously, result in a denser packing of the corrugated capacitor structures 362/364/366, resulting in an increased capacitance per unit area.

Figure 14:
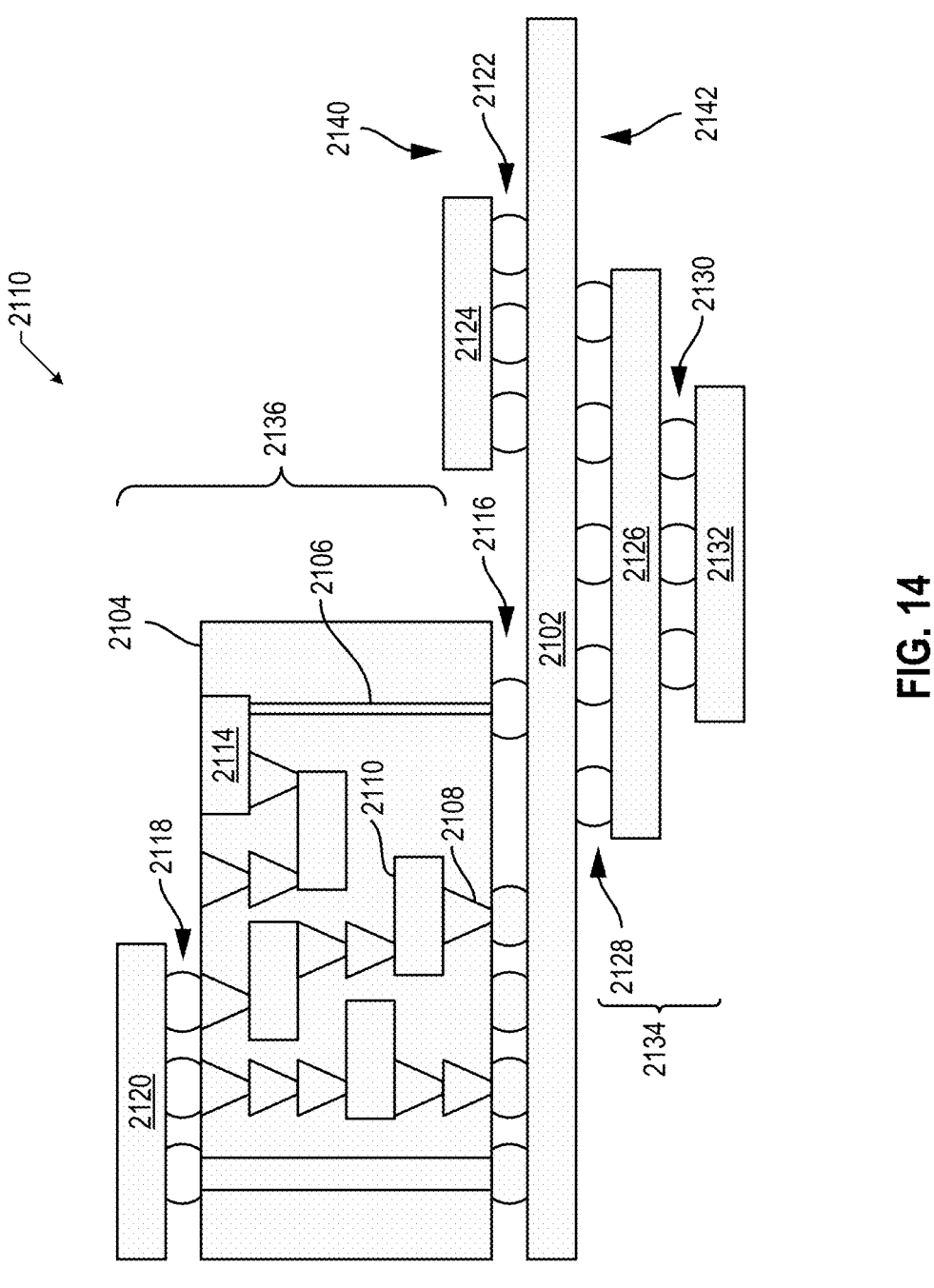
FIG. 14 illustrates a cross-sectional side view of an IC device assembly that may include one or more 3D interlocked corrugated capacitor structures in accordance with any of the embodiments disclosed herein.
Figure 15:
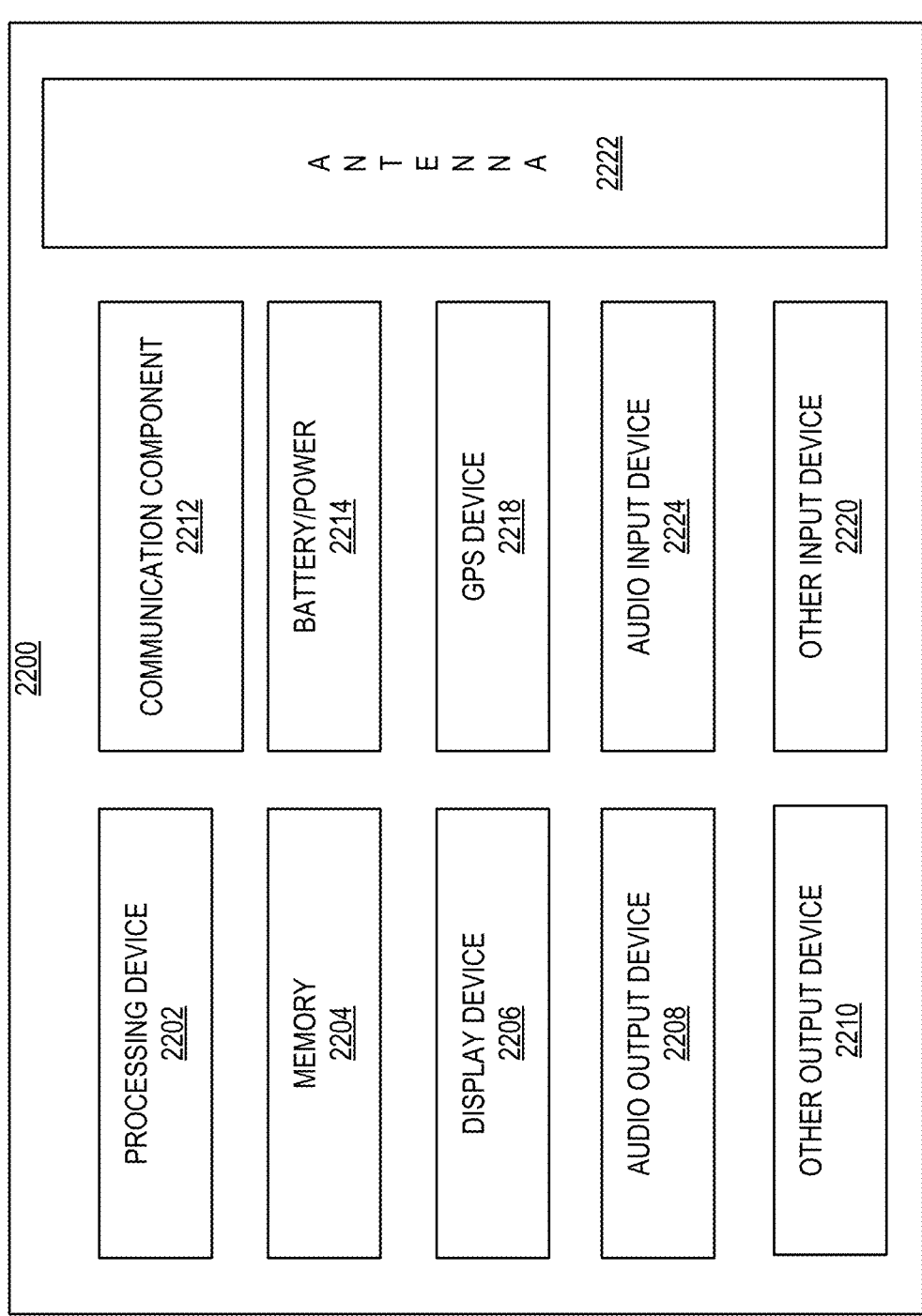
FIG. 15 illustrates a block diagram of an example computing device that may include one or more 3D interlocked corrugated capacitor structures in accordance with any of the embodiments disclosed herein.

The IC structures with 3D interlocked corrugated capacitor structures disclosed herein (e.g., with the 3D interlocked corrugated capacitor structures 250/362/364/366) may be included in any suitable electronic device. FIGS. 13-15 illustrate various examples of apparatuses that may include one or more 3D interlocked corrugated capacitor structures disclosed herein (e.g., one or more 3D interlocked corrugated capacitor structures 250/362/364/366 according to any of the embodiments disclosed herein).

FIG. 13 illustrates top views of a wafer and dies that include one or more 3D interlocked corrugated capacitor structures in accordance with any of the embodiments disclosed herein. The wafer 2000 may be composed of semiconductor material and may include one or more dies 2002 having IC structures formed on a surface of the wafer 2000. Each of the dies 2002 may be a repeating unit of a semiconductor product that includes any suitable IC structure (e.g., the IC structure with one or more 3D interlocked corrugated capacitor structures). After the fabrication of the semiconductor product is complete (e.g., after manufacture of one or more IC structures with one or more 3D interlocked corrugated capacitor structures as described herein, included in a particular IC device, e.g., in an IC device 100/200), the wafer 2000 may undergo a singulation process in which each of the dies 2002 is separated from one another to provide discrete "chips" of the semiconductor product. In particular, devices that include one or more IC structures with one or more 3D interlocked corrugated capacitor structures as disclosed herein may take the form of the wafer 2000 (e.g., not singulated) or the form of the die 2002 (e.g., singulated). The die 2002 may include one or more transistors (e.g., one or more of the transistors 222 of FIG. 2, discussed below) and/or supporting circuitry to route electrical signals to the transistors, as well as any other IC components (e.g., one or more IC structures with one or more 3D interlocked corrugated capacitor structures as discussed herein). In some embodiments, the wafer 2000 or the die 2002 may include a memory device (e.g., a static random-access memory (SRAM) device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2202 of FIG. 15) or other logic that is configured to store information in the memory devices or execute instructions stored in the memory array.

FIG. 14 illustrates a cross-sectional side view of an IC device assembly 2100 that may include components having or being associated with (e.g. being electrically connected by means of) one or more IC devices with one or more 3D interlocked corrugated capacitor structures in accordance with any of the embodiments disclosed herein. The IC device assembly 2100 includes a number of components disposed on a circuit board 2102 (which may be, e.g., a motherboard). The IC device assembly 2100 includes components disposed on a first face 2140 of the circuit board 2102 and an opposing second face 2142 of the circuit board 2102; generally, components may be disposed on one or both faces 2140 and 2142. In particular, any suitable ones of the components of the IC device assembly 2100 may include any of the 3D interlocked corrugated capacitor structures, disclosed herein.

In some embodiments, the circuit board 2102 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2102. In other embodiments, the circuit board 2102 may be a non-PCB substrate.

The IC device assembly 2100 illustrated in FIG. 14 includes a package-on-interposer structure 2136 coupled to the first face 2140 of the circuit board 2102 by coupling components 2116. The coupling components 2116 may electrically and mechanically couple the package-on-interposer structure 2136 to the circuit board 2102, and may include solder balls (as shown in FIG. 14), male and female portions of a socket, an adhesive, an underfill material, and/or any other suitable electrical and/or mechanical coupling structure.

The package-on-interposer structure 2136 may include an IC package 2120 coupled to an interposer 2104 by coupling components 2118. The coupling components 2118 may take any suitable form for the application, such as the forms discussed above with reference to the coupling components 2116. Although a single IC package 2120 is shown in FIG. 14, multiple IC packages may be coupled to the interposer 2104; indeed, additional interposers may be coupled to the interposer 2104. The interposer 2104 may provide an intervening substrate used to bridge the circuit board 2102 and the IC package 2120. The IC package 2120 may be or include, for example, a die (the die 2002 of FIG. 13), an IC device (e.g., the IC device 200 of FIG. 2), or any other suitable component. In some embodiments, the IC package 2120 may include one or more 3D interlocked corrugated capacitor structures, as described herein. Generally, the interposer 2104 may spread a connection to a wider pitch or reroute a connection to a different connection. For example, the interposer 2104 may couple the IC package 2120 (e.g., a die) to a ball grid array (BGA) of the coupling components 2116 for coupling to the circuit board 2102. In the embodiment illustrated in FIG. 14, the IC package 2120 and the circuit board 2102 are attached to opposing sides of the interposer 2104; in other embodiments, the IC package 2120 and the circuit board 2102 may be attached to a same side of the interposer 2104. In some embodiments, three or more components may be interconnected by way of the interposer 2104.

The interposer 2104 may be formed of an epoxy resin, a fiberglass-reinforced epoxy resin, a ceramic material, or a polymer material such as polyimide. In some implementations, the interposer 2104 may be formed of alternate rigid or flexible materials that may include the same materials described above for use in a semiconductor substrate, such as silicon, germanium, and other group III-V and group IV materials. The interposer 2104 may include metal interconnects 2108 and vias 2110, including but not limited to TSVs 2106. The interposer 2104 may further include embedded devices 2114, including both passive and active devices.

Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 2104. The interposer 2104 may further include one or more 3D interlocked corrugated capacitor structures as described herein. The package-on-interposer structure 2136 may take the form of any of the package-on-interposer structures known in the art.

The IC device assembly 2100 may include an IC package 2124 coupled to the first face 2140 of the circuit board 2102 by coupling components 2122. The coupling components 2122 may take the form of any of the embodiments discussed above with reference to the coupling components 2116, and the IC package 2124 may take the form of any of the embodiments discussed above with reference to the IC package 2120.

The IC device assembly 2100 illustrated in FIG. 14 includes a package-on-package structure 2134 coupled to the second face 2142 of the circuit board 2102 by coupling components 2128. The package-on-package structure 2134 may include an IC package 2126 and an IC package 2132 coupled together by coupling components 2130 such that the IC package 2126 is disposed between the circuit board 2102 and the IC package 2132. The coupling components 2128 and 2130 may take the form of any of the embodiments of the coupling components 2116 discussed above, and the IC packages 2126 and 2132 may take the form of any of the embodiments of the IC package 2120 discussed above. The package-on-package structure 2134 may be configured in accordance with any of the package-on-package structures known in the art.

FIG. 15 illustrates a block diagram of an example computing device 2200 that may include one or more components including one or more IC devices with one or more 3D interlocked corrugated capacitor structures 250/362/364/366 in accordance with any of the embodiments disclosed herein. For example, any suitable ones of the components of the computing device 2200 may include a die (e.g., the die 2002 of FIG. 13) having one or more 3D interlocked corrugated capacitor structures 250/362/364/366 as described herein. Any one or more of the components of the computing device 2200 may include, or be included in, an IC device 200 of FIG. 2. Any one or more of the components of the computing device 2200 may include, or be included in, an IC device assembly 2100 of FIG. 14.

A number of components are illustrated in FIG. 15 as included in the computing device 2200, but any one or more of these components may be omitted or duplicated, as suitable for the application. In some embodiments, some or all of the components included in the computing device 2200 may be attached to one or more motherboards. In some embodiments, some or all of these components are fabricated onto a single system-on-a-chip (SoC) die.

Additionally, in various embodiments, the computing device 2200 may not include one or more of the components illustrated in FIG. 15, but the computing device 2200 may include interface circuitry for coupling to the one or more components. For example, the computing device 2200 may not include a display device 2206, but may include display device interface circuitry (e.g., a connector and driver circuitry) to which a display device 2206 may be coupled. In another set of examples, the computing device 2200 may not include an audio input device 2224 or an audio output device 2208, but may include audio input or output device interface circuitry (e.g., connectors and supporting circuitry) to which an audio input device 2224 or audio output device 2208 may be coupled.

The computing device 2200 may include a processing device 2202 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2202 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2200 may include a memory 2204, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, the memory 2204 may include memory that shares a die with the processing device 2202. This memory may be used as cache memory and may include embedded dynamic random-access memory (eDRAM) or spin transfer torque magnetic random-access memory (STT-MRAM).

In some embodiments, the computing device 2200 may include a communication chip 2212 (e.g., one or more communication chips). For example, the communication chip 2212 may be configured for managing wireless communications for the transfer of data to and from the computing device 2200. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2212 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2212 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2212 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2212 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 20G, 21G, and beyond. The communication chip 2212 may operate in accordance with other wireless protocols in other embodiments. The computing device 2200 may include an antenna 2222 to facilitate wireless communications and/or to receive other wireless communications (such as AM or FM radio transmissions).

In some embodiments, the communication chip 2212 may manage wired communications, such as electrical, optical, or any other suitable communication protocols (e.g., the Ethernet). As noted above, the communication chip 2212 may include multiple communication chips. For instance, a first communication chip 2212 may be dedicated to shorter-range wireless communications such as Wi-Fi or Bluetooth, and a second communication chip 2212 may be dedicated to longer-range wireless communications such as global positioning system (GPS), EDGE, GPRS, CDMA, WiMAX, LTE, EV-DO, or others. In some embodiments, a first communication chip 2212 may be dedicated to wireless communications, and a second communication chip 2212 may be dedicated to wired communications.

The computing device 2200 may include battery/power circuitry 2214. The battery/power circuitry 2214 may include one or more energy storage devices (e.g., batteries or capacitors) and/or circuitry for coupling components of the computing device 2200 to an energy source separate from the computing device 2200 (e.g., AC line power).

The computing device 2200 may include a display device 2206 (or corresponding interface circuitry, as discussed above). The display device 2206 may include any visual indicators, such as a heads-up display, a computer monitor, a projector, a touchscreen display, a liquid crystal display (LCD), a light-emitting diode display, or a flat panel display, for example.

The computing device 2200 may include an audio output device 2208 (or corresponding interface circuitry, as discussed above). The audio output device 2208 may include any device that generates an audible indicator, such as speakers, headsets, or earbuds, for example.

The computing device 2200 may include an audio input device 2224 (or corresponding interface circuitry, as discussed above). The audio input device 2224 may include any device that generates a signal representative of a sound, such as microphones, microphone arrays, or digital instruments (e.g., instruments having a musical instrument digital interface (MIDI) output).

The computing device 2200 may include a GPS device 2218 (or corresponding interface circuitry, as discussed above). The GPS device 2218 may be in communication with a satellite-based system and may receive a location of the computing device 2200, as known in the art.

The computing device 2200 may include an other output device 2210 (or corresponding interface circuitry, as discussed above). Examples of the other output device 2210 may include an audio codec, a video codec, a printer, a wired or wireless transmitter for providing information to other devices, or an additional storage device.

The computing device 2200 may include an other input device 2220 (or corresponding interface circuitry, as discussed above). Examples of the other input device 2220 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2200 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2200 may be any other electronic device that processes data.

Select Examples

The following paragraphs provide various examples of the embodiments disclosed herein.

Example 1 provides an IC device that includes a support structure (e.g., a substrate, a die, a wafer, or a chip); an insulator material over the support structure; and a plurality of corrugated capacitor structures in the insulator material, where an individual corrugated capacitor structure of the plurality includes a via extending substantially vertically into the insulator material by a length, and further includes protrusions from the via, the protrusions extending substantially horizontally into the insulator material away from the via, where a projection of at least one of the protrusions of a first corrugated capacitor structure of the plurality onto a plane parallel to the support structure overlaps with a projection of at least one of the protrusions of a second corrugated capacitor structure of the plurality onto the plane.

Example 2 provides the IC device according to example 1, where at least 10% of the projection of the at least one of the protrusions of the first corrugated capacitor structure onto the plane overlaps with the projection of the at least one of the protrusions of the second corrugated capacitor structure onto the plane.

Example 3 provides the IC device according to examples 1 or 2, where the insulator material separates the protrusions of the first corrugated capacitor structure and the protrusions of the second corrugated capacitor structure.

Example 4 provides the IC device according to any one of the preceding examples, where a thickness of a layer of the insulator material separating the at least one of the protrusions of the first corrugated capacitor structure and a nearest one of the protrusions of the second corrugated capacitor structure is between about 25 nanometers and 250 nanometers.

Example 5 provides the IC device according to any one of the preceding examples, where, for the individual corrugated capacitor structure, the protrusions extending substantially horizontally into the insulator material away from the via by a distance between about 10 nanometer and 500 nanometers.

Example 6 provides the IC device according to any one of the preceding examples, where the protrusions of the first corrugated capacitor structure are in different planes above the support structure than the protrusions of the second corrugated capacitor structure.

Example 7 provides the IC device according to any one of the preceding examples, further including a capacitor stack on inner walls of the individual corrugated capacitor structure.

Example 8 provides the IC device according to example 7, where, the capacitor stack includes a layer of a first electrically conductive material, a layer of a second electrically conductive material, and a layer of an insulator material between the layer of the first electrically conductive material and the layer of the second electrically conductive material.

Example 9 provides the IC device according to example 8, where, for an individual wall of the inner walls, the layer of the first electrically conductive material is closer to the individual wall than the layer of the insulator material.

Example 10 provides the IC device according to examples 8 or 9, where a thickness of the layer of the first electrically conductive material or a thickness of the layer of the second electrically conductive material is between about 1 nanometer and 100 nanometers.

Example 11 provides the IC device according to any one of the preceding examples, where the projection of the at least one of the protrusions of the first corrugated capacitor structure onto the plane further overlaps with a projection of at least one of the protrusions of a third corrugated capacitor structure of the plurality onto the plane.

Example 12 provides the IC device according to example 11, where the projection of the at least one of the protrusions of the first corrugated capacitor structure onto the plane further overlaps with a projection of at least one of the protrusions of a fourth corrugated capacitor structure of the plurality onto the plane and a projection of at least one of the protrusions of a fifth corrugated capacitor structure of the plurality onto the plane.

Example 13 provides the IC device according to example 12, where the at least one of the protrusions of the first corrugated capacitor structure is in a first plane above the support structure; individual ones of the at least one of the protrusions of the second corrugated capacitor structure, the at least one of the protrusions of the third corrugated capacitor structure, the at least one of the protrusions of the fourth corrugated capacitor structure, and the at least one of the protrusions of the fifth corrugated capacitor structure are in a second plane above the support structure; and a portion of the insulator material separates the first plane and the second plane.

Example 14 provides the IC device according to any one of the preceding examples, where the corrugated capacitor structures of the plurality are arranged in a rectangular array.

Example 15 provides the IC device according to any one of examples 1-10, where the corrugated capacitor structures of the plurality are arranged in a hexagon array.

Example 16 provides an IC device that includes a support structure (e.g., a substrate, a die, a wafer, or a chip); an insulator material over the support structure; a first capacitor structure including a first opening in the insulator material, a first ledge extending away from the first opening into the insulator material, and a first capacitor stack on inner sidewalls of the first capacitor structure; and a second capacitor structure including a second opening in the insulator material, a second ledge extending away from the second opening into the insulator material, and a second capacitor stack on inner sidewalls of the second capacitor structure, where the first ledge and the second ledge are interlocked.

Example 17 provides the IC device according to example 16, where the first ledge and the second ledge are in different layers above the support structure.

Example 18 provides the IC device according to examples 16 or 17, where the second capacitor structure is one of two or more capacitor structures, an individual capacitor structure of the two or more capacitor structures includes a opening in the insulator material, a ledge extending away from the opening into the insulator material, and a capacitor stack on inner sidewalls of the individual capacitor structure, and the first ledge is interlocked with the ledge of each of the two or more capacitor structures.

Example 19 provides an IC package that includes an IC device according to any one of the preceding examples; and a further component, coupled to the IC device. For example, the IC die may include a layer of an insulator material, and the IC device may include a first capacitor structure comprising a first via in the insulator material and a first protrusion having a shape of a first ring extending away from the first via into the insulator material, and a second capacitor structure comprising a second via in the insulator material and a second protrusion having a shape of a second ring extending away from the second via into the insulator material, where the second ring is interlocked with the first ring.

Example 20 provides the IC package according to example 19, where the further component is or includes one of a package substrate, an interposer, or a further IC die.

In various further examples of the IC package according to examples 19 or 20, the further component may be coupled to the IC die via one or more first-level interconnects, where the one or more first-level interconnects may include one or more solder bumps, solder posts, or bond wires.

In further examples of the IC package according to any of the preceding examples, the IC die includes, or is a part of, at least one of a memory device, a computing device, a wearable device, a handheld electronic device, and a wireless communications device.

Example 21 provides an electronic device that includes a carrier substrate; and one or more of the IC device according to any one of the preceding examples and the IC package according to any one of the preceding examples, coupled to the carrier substrate.

Example 22 provides the electronic device according to example 21, where the carrier substrate is a motherboard.

Example 23 provides the electronic device according to example 21, where the carrier substrate is a PCB.

Example 24 provides the electronic device according to any one of examples 21-23, where the electronic device is a wearable electronic device (e.g., a smart watch) or handheld electronic device (e.g., a mobile phone).

Example 25 provides the electronic device according to any one of examples 21-24, where the electronic device further includes one or more communication chips and an antenna.

Example 26 provides the electronic device according to any one of examples 21-25, where the electronic device is a memory device.

Example 27 provides the electronic device according to any one of examples 21-25, where the electronic device is one of an RF transceiver, a switch, a power amplifier, a low-noise amplifier, a filter, a filter bank, a duplexer, an upconverter, or a downconverter of an RF communications device, e.g., of an RF transceiver.

Example 28 provides the electronic device according to any one of examples 21-25, where the electronic device is a computing device.

Example 29 provides the electronic device according to any one of examples 21-28, where the electronic device is included in a base station of a wireless communication system.

Example 30 provides the electronic device according to any one of examples 21-28, where the electronic device is included in a user equipment device (i.e., a mobile device) of a wireless communication system.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
a support structure;
an insulator material over the support structure;
a plurality of corrugated capacitor structures in the insulator material, wherein an individual corrugated capacitor structure of the plurality includes a via extending substantially vertically into the insulator material, and further includes protrusions from the via, the protrusions extending substantially horizontally into the insulator material away from the via; and
a capacitor stack on inner walls of the individual corrugated capacitor structure, the capacitor stack including a layer of a first electrically conductive material, a layer of a second electrically conductive material, and a layer of an insulator material between the layer of the first electrically conductive material and the layer of the second electrically conductive material,
wherein a projection of at least one of the protrusions of a first corrugated capacitor structure of the plurality onto a plane parallel to the support structure overlaps with a projection of at least one of the protrusions of a second corrugated capacitor structure of the plurality onto the plane.

2. The IC device according to claim 1, wherein at least 10% of the projection of the at least one of the protrusions of the first corrugated capacitor structure onto the plane overlaps with the projection of the at least one of the protrusions of the second corrugated capacitor structure onto the plane.

3. The IC device according to claim 1, wherein the insulator material separates the protrusions of the first corrugated capacitor structure and the protrusions of the second corrugated capacitor structure.

4. The IC device according to claim 1, wherein a thickness of a layer of the insulator material separating the at least one of the protrusions of the first corrugated capacitor structure and a nearest one of the protrusions of the second corrugated capacitor structure is between about 25 nanometers and 250 nanometers.

5. The IC device according to claim 1, wherein, for the individual corrugated capacitor structure, the protrusions extending substantially horizontally into the insulator material away from the via by a distance between about 10 nanometer and 500 nanometers.

6. The IC device according to claim 1, wherein the protrusions of the first corrugated capacitor structure are in different planes above the support structure than the protrusions of the second corrugated capacitor structure.

7. The IC device according to claim 1, wherein, for an individual wall of the inner walls, the layer of the first electrically conductive material is closer to the individual wall than the layer of the insulator material.

8. The IC device according to claim 1, wherein a thickness of the layer of the first electrically conductive material or a thickness of the layer of the second electrically conductive material is between about 1 nanometer and 100 nanometers.

9. The IC device according to claim 1, wherein the projection of the at least one of the protrusions of the first corrugated capacitor structure onto the plane further overlaps with a projection of at least one of the protrusions of a third corrugated capacitor structure of the plurality onto the plane.

10. The IC device according to claim 9, wherein the projection of the at least one of the protrusions of the first corrugated capacitor structure onto the plane further overlaps with a projection of at least one of the protrusions of a fourth corrugated capacitor structure of the plurality onto the plane and a projection of at least one of the protrusions of a fifth corrugated capacitor structure of the plurality onto the plane.

11. The IC device according to claim 10, wherein:

the at least one of the protrusions of the first corrugated capacitor structure is in a first plane above the support structure, individual ones of the at least one of the protrusions of the second corrugated capacitor structure, the at least one of the protrusions of the third corrugated capacitor structure, the at least one of the protrusions of the fourth corrugated capacitor structure, and the at least one of the protrusions of the fifth corrugated capacitor structure are in a second plane above the support structure, and a portion of the insulator material separates the first plane and the second plane.

12. The IC device according to claim 1, wherein the corrugated capacitor structures of the plurality are arranged in a rectangular array or a hexagon array.

13. The IC device according to claim 1, wherein the insulator material over the support structure is a first insulator material, and the insulator material of the layer of the insulator material is a second insulator material.

14. The IC device according to claim 1, wherein:

the capacitor stack is conformal to the inner walls of the individual corrugated capacitor structure.

15. The IC device according to claim 1, wherein, in the individual corrugated capacitor structure:

the layer of the first electrically conductive material is conformal to the inner walls of the individual corrugated capacitor structure, the layer of the insulator material is conformal to the layer of the first electrically conductive material on the inner walls of the individual corrugated capacitor structure, and the layer of the second electrically conductive material is conformal to the layer of the insulator material.

16. An integrated circuit (IC) device, comprising:

a substrate;

a first insulator material over the substrate;

a first capacitor structure comprising a first via in the first insulator material, a first ledge extending away from the first via into the first insulator material, and a first capacitor stack on inner sidewalls of the first capacitor structure; and a second capacitor structure comprising a second via in the first insulator material, a second ledge extending away from the second via into the first insulator material, and a second capacitor stack on inner sidewalls of the second capacitor structure, wherein;

the first ledge and the second ledge are interlocked, the first capacitor stack includes a first conductive material, a second conductive material, and a second insulator material between the first conductive material and the second conductive material, and the second capacitor stack includes a third conductive material, a fourth conductive material, and a third insulator material between the third conductive material and the fourth conductive material.

17. The IC device according to claim 16, wherein the first ledge and the second ledge are in different layers above the substrate.

18. The IC device according to claim 16, wherein:

the second capacitor structure is one of two or more capacitor structures, an individual capacitor structure of the two or more capacitor structures includes a opening in the first insulator material, a ledge extending away from the opening into the first insulator material, and a capacitor stack on inner sidewalls of the individual capacitor structure, and the first ledge is interlocked with the ledge of each of the two or more capacitor structures.

19. The IC device according to claim 16, wherein the first capacitor stack is conformal to the inner sidewalls of the first capacitor structure, and the second capacitor stack is conformal to the inner sidewalls of the second capacitor structure.

20. The IC device according to claim 16, wherein the first capacitor structure and the second capacitor structure are two capacitor structures of a plurality of capacitor structures, and wherein the capacitor structures of the plurality are in a rectangular array or a hexagon array.

21. An integrated circuit (IC) package, comprising:

an IC die, comprising an IC device; and a further component, coupled to the IC die, wherein the IC die includes a layer of a first insulator material, and the IC device includes a first capacitor structure comprising a first via in the first insulator material and a first protrusion having a shape of a first disc extending away from the first via into the first insulator material, and a second capacitor structure comprising a second via in the first insulator material and a second protrusion having a shape of a second disc extending away from the second via into the first insulator material, wherein the second disc is interlocked with the first disc, wherein the IC device further includes a first capacitor stack on inner sidewalls of the first protrusion, and a second capacitor stack on inner sidewalls of the second protrusion, and wherein the first capacitor stack includes a first conductive material, a second conductive material, and a second insulator material between the first conductive material and the second conductive material, and wherein the second capacitor stack includes a third conductive material, a fourth conductive material, and a third insulator material between the third conductive material and the fourth conductive material.

22. The IC package according to claim 21, wherein the further component is one of a package substrate, an interposer, or a further IC die.

\* \* \* \* \*